United States Patent [19]

Matsuoka et al.

[11] Patent Number: 4,911,814

[45] Date of Patent: Mar. 27, 1990

[54] THIN FILM FORMING APPARATUS AND ION SOURCE UTILIZING SPUTTERING WITH MICROWAVE PLASMA

[75] Inventors: Morito Matsuoka, Katsuta; Kenichi Ono, Mito, both of Japan

[73] Assignee: Nippon Telegraph and Telephone Corporation, Tokyo, Japan

[21] Appl. No.: 307,312

[22] Filed: Feb. 7, 1989

[30] Foreign Application Priority Data

| Feb. 8, 1988 | [JP] | Japan | 63-25601 |
| Feb. 8, 1988 | [JP] | Japan | 63-25602 |
| Feb. 29, 1988 | [JP] | Japan | 63-44214 |
| Feb. 29, 1988 | [JP] | Japan | 63-44215 |

[51] Int. Cl.$^4$ ............... C23C 14/34; H01J 27/00
[52] U.S. Cl. ............... 204/298; 204/192.12; 250/492.3; 250/423 R; 315/111.41; 315/111.81
[58] Field of Search ............... 204/298 MW, 298 BD, 204/298 TS, 298 ME, 298 SG; 118/50.1; 315/111.41, 111.81; 250/423 R, 492.3

[56] References Cited

U.S. PATENT DOCUMENTS

| 4,450,031 | 5/1984 | Ono et al. | 204/298 X |
| 4,492,620 | 1/1985 | Matsuo et al. | 204/298 MW X |

FOREIGN PATENT DOCUMENTS

| 0273741 | 7/1988 | European Pat. Off. | 204/298 |
| 60-50167 | 3/1985 | Japan . | |
| 62-222064 | 9/1987 | Japan . | |
| 62-224686 | 10/1987 | Japan . | |
| 3227777 | 9/1988 | Japan | 204/298 |

OTHER PUBLICATIONS

"Planar Magnetron Sputtering", Robert K. Waits et al., 15 (2), 1978, pp. 179–187.
"Rf and dc Discharge Characteristics for Opposed–Targets Sputtering", M. Matsuoka et al.; J. Appln. Phys., 60 (6), 1986, pp. 2096–2102.
"An Electron Cyclotron Resonance Plasma Deposition Technique Employing Magnetron Mode Sputtering", C. Takahashi et al; J. Vac. Sic. Technol., vol. A6, 1988, pp. 2348–2352.
"A Low-Energy Metal-Ion Source for Primary Ion Deposition and Accelerated Ion Doping During Molecular-Epitaxy", M. A. Hasan et al., J. Vac. Sci. Technol., B5(5), 1987, pp. 1332–1339.
"Anode Sputtering Characteristics of the Berkeley 2.5 Mv Source", B. Gavin; IEEE Trans. Nucl. Sci., NS-23, 1976, pp. 1008–1012.
"A New Sputtering Type of Ion Source for Ion Beam Deposition of Thin Films", N. Terada et al.; Proc. Int'l Ion Engineering Congress, Isiat '83, 1983, pp. 999–1004.
"Characteristics of Penning Ionization Gauge Type Compact Microwave Metal Ion Source", Y. Yoshida et al.; J. Vac. Sci. Technol., vol. A6, 1988, pp. 2451–2456.

*Primary Examiner*—Nam X. Nguyen
*Attorney, Agent, or Firm*—Cushman, Darby & Cushman

[57] ABSTRACT

A thin film forming apparatus comprises a plasma generating chamber into which is introduced a gas to generate plasma therein; a microwave introduction window connected to the plasma generating chamber for introducing the microwave into the latter, a first target and a second target made of materials to be sputtered and disposed at both end portions of interior of the plasma generating chamber, respectively, at least one of the first and second targets being in the form of a tube, at least one power supply for applying a negative voltage to the first and second targets, magnetic field producing means for producing the magnetic field and the magnetic flux leaving one of the first and second targets and entering the other, and a specimen chamber communicated to the plasma generating chamber and having a substrate holder installed therein. High-density ECR plasma generated within the plasma generating chamber sputters the targets so that the sputtered target materials are deposited on a substrate to form a thin film. It is also possible to extract ions in plasma by incorporating an ion extraction mechanism at the lower end of the plasma generating chamber.

26 Claims, 29 Drawing Sheets

FIG.4a
FIG.4b
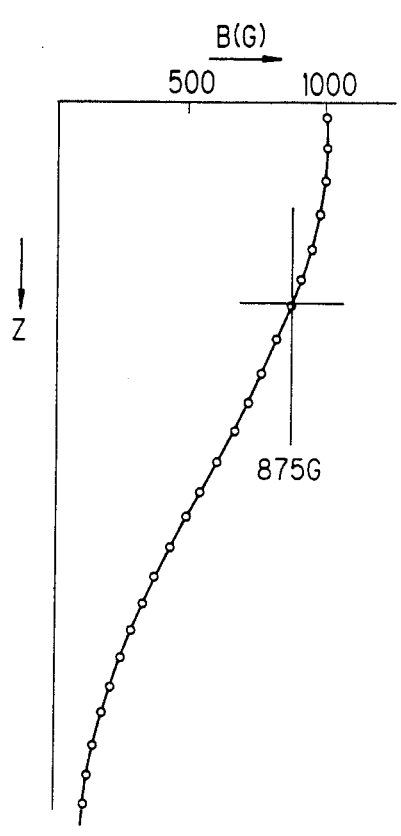
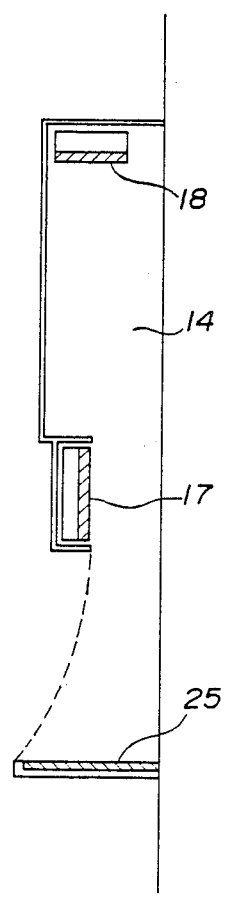

THIN FILM FORMING APPARATUS AND ION SOURCE UTILIZING SPUTTERING WITH MICROWAVE PLASMA

BACKGROUND OF THE INVENTION

1. Field of the Invention

The present invention relates to apparatuses for forming thin films on specimen substrates and apparatuses for extracting ions for forming thin films on specimen substrates, etching the surface of a thin film or improving the quality of the surface of a thin film, and more particularly a novel film forming apparatus capable of forming thin films of various materials at a high film growing rate with a high efficiency and stability for a long period of time by utilizing high-density plasma generated by electron cyclotron resonance and a novel sputtering type ion source cable of extracting various ions of high current density with a high efficiency and stability for a long period of time. Furthermore, the present invention relates to a plasma generating apparatus which is capable of generating high-density plasma in a gas under a low pressure and which can be utilized with the film forming apparatus and the ion source.

2. Description of the Prior Art

In various types of LSI production processes, the techniques regarding to the formation of thin films and to ion sources presently occupy very important positions.

In the conventional sputtering apparatuses, the discharge cannot be maintained in a stable manner in a low gas pressure range less than $10^{-3}$ Torr and plasma is generated only at a gas pressure of the order of or higher than $10^{-2}$ Torr, so that there arises the problem that a large amount of impurities are penetrated into the thin film.

The particles which contribute to the growth of a thin film are almost neutral and it has been difficult to control the energy of such neutral particles.

Meanwhile, the magnetron sputtering apparatuses (for instance, as disclosed by R. K. Waits, J. Vac. Sci. Technol., Vol. 15 (1978), pp.179-187) and the facing targets sputtering apparatuses (for instance, as disclosed by M. Matsuoka et al., J. Apply. Phys., Vol. 60 (1986), pp.2096-2102) which permit a high-rate sputtering in a gas under a low pressure have been devised and demonstrated.

In the magnetron sputtering apparatuses, the high-energy secondary electrons are trapped over the surface of the target b the effects of the magnetic field closed over the surface of the target and the electric field over the surface of the target so that high-density plasma can be generated in a gas at a low pressure. However, they have the problem that the qualities of the portions of a grown film corresponding to the eroded portions of the target and to the not eroded portions, respectively, are widely different from each other. Furthermore, when the target is made of a magnetic material such as Fe, the magnetic flux does not leak to the surface of the target so that high-density plasma cannot be generated and the kinds of thin films to be formed are limited.

FIG. 1 shows a conventional facing targets sputtering apparatus. A sputtering chamber 1 can be evacuated by a vacuum pump and gases for generating plasma are introduced from gas inlet 2. In the chamber 1, substrate holder 3 for supporting a substrate 4 is disposed. A heater 5 is incorporated in the holder 3. Two targets 6 and 7 are arranged in opposing relationship with each other. Magnets 8 and 9 for applying magnetic field on the targets 6 and 7 are incorporated in target holders 10 and 11, respectively. Target holders are electrically insulated from the chamber 1 by insulators 12 and 13. When discharge is effected in the chamber 1, the high-energy secondary electrons are confined between the targets to generate high-density plasma between targets. They have one of the special features that almost all kinds of thin films can be formed over the surface of the substrate 4 at a high deposition rate. In this apparatus, the impingement of the high-energy particles on the surface of the substrate is decreased so that this apparatus is regarded as one of the better apparatus for forming a high quality thin film at low temperatures. However, the targets 6 and 7 are disposed in opposing relationship and are spaced apart from each other by a suitable distance, so that the substrate 4 must be located at a horizontal position and the deposition rate of the sputtered particles deposited over the surface of the substrate 4 is low. Furthermore, in the case of coating a large surface of a large-sized disc or the like, there arises the problem that the deposition rate or efficiency is essentially low when the targets are disposed in the manner described above.

If it is desired to form a thin film at lower temperatures, highly active plasma with a high ionization rate must be utilized. In the case of forming reactive thin films such as oxide films, nitride films and so on, especially the reactivity of plasma is important.

As one method for forming various thin films at low temperatures there has been devised and demonstrated a sputtering type ECR microwave plasma deposition apparatus which utilizes electron cyclotron resonance (ECR) plasma and sputtering (for instance, as disclosed S. Matsuo et al. U.S. Pat. No. 4,492,620). This apparatus offers an excellent method for forming thin films at low temperatures by combining the supply of a metal by sputtering with the irradiation of a substrate with microwave plasma.

However, when the conventional ECR sputtering apparatuses are used to form thin films at a high deposition rate, the density of the microwave plasma must be increased so that there arises a defect that damages to a thin film being gown and to a substrate are increased.

Meanwhile, in order to attain the formation of a thin film at a high deposition rate, there has been devised and demonstrated an ECR sputtering apparatus in combination with the magnetron discharge on a target (for instance, as disclosed by C. Takahashi et al. J. Vac. Sic. Technol., Vol. A6 (1988), pp.2348-2352). However, according to the above-mentioned technique, one or more special magnetic circuits must be provided in order to define a closed magnetic flux distribution over a target. Furthermore, the high-density plasma exists locally on the target so that the interaction between the locally existing high density plasma and the microwave plasma is weak. As a result, there arises the problem that the efficient thin film growth cannot be carried out in the lower gas pressure range.

Meanwhile, the ion sources which utilize an ion extracting mechanism such as a grid to extract the ions produced in plasma have been widely used for forming thin films of various materials, etching the surface of a formed thin film, processing the formed thin films and so on.

As the metal ion sources, the evaporation type ion sources and the sputtering type ion sources are well known to those skilled in the art. However, the evaporation type ion sources must maintain the temperature within its furnace at high temperatures, so that the vaporized particles are ionized and consequently impurities most frequently tend to be contained in a thin film being grown. Furthermore, the extraction of ions of a material having a high melting point is difficult (for instance, as disclosed by M. A. Hasan et al., J. Vac Sci. Technol., Vol. B5 (1987), pp.1332-1339). In the cases of the sputtering type ion sources, metal ions obtained by sputtering a target in plasma are selectively extracted, but it is difficult to extract high current ions over a large area (for instance, as reported by B. Gavin, IEEE Trans. Nucl. Sci , Vol. NS-23 (1976), pp.1008-1112).

In order to realize a high-current ion source by utilizing sputtering, the plasma density must be maintained at a high level with a high efficiency. To this end, the secondary electrons emitted from the target must be efficiently confined, but the conventional ion sources cannot satisfactorily confine the secondary electrons.

An ion extracting method with a high-efficiency and a large-area is disclosed by, for instance, N. Terada et al., Proc. Int'l Ion Engineering Congress, ISIAT'83 and IPAT'83, Kyoto (1983), pp.999-1004. According to this method, a negative potential is applied to a pair of opposing targets so that the high-energy secondary electrons are confined between the targets by the magnetic field produced therebetween. As a result, high-density plasma can be generated and the extraction of metal ions can be realized with a high efficiency. However, according to this method, the ion extracting holes are formed through the target so that the target itself has a function of a grid which is means for extracting ions. As a result, it is difficult to extract ions in a stable manner for a long period of time.

It is preferable to utilize plasma generated in the low gas pressure range as much as possible in order to increase the ratio of metal ions in extracted ions. However, when the discharge on the target itself is utilized in a simple manner, there arises the problems that the stability in the low gas pressure range is not satisfactory and that the extraction of large current ions cannot be accomplished at a pressure of $10^{-4}$ Torr.

It has been therefore considered that when ECR plasma which can be generated in a stable manner even at a low pressure of the order of $10^{-5}$ Torr is combined with an ion source, the ion extraction could be realized by utilizing plasma generated in a stable manner even at the low pressure gas region.

Based upon the above-mentioned technical idea, there has been proposed an ion source in which the microwave discharge and the Pening discharge are combined (for instance, as disclosed by Y. Yoshida et al. J. Vac. Sci Techol., Vol. A6 1988, pp.2451-2456). However, even when such technique is utilized, since a loop antenna for introduction of the microwave is consumed by sputtering, not only the ion extraction in a stable manner for a long period cannot be carried out but also the technique is not essentially adapted to extract ions over a large area.

An ion shower apparatus utilizing ECR plasma was disclosed by Ono et al. (U.S. Pat. 4,450,031). However, the conventional ion sources utilizing the microwave plasma generated by utilizing ECR have no source for emitting metal ions so that it is impossible to extract metal ions. Furthermore, even when a target is disposed in an apparatus as a metal ion emission source, the density of the microwave plasma must be increased so that the ion extraction mechanism such as grids or the like receives impingement with particle in the plasma and consequently the stable ion extraction cannot be carried out.

As described above, the conventional film forming methods cannot satisfy the following conditions simultaneously:

(a) A thin film is formed at a high deposition rate without causing the damages to a thin film being grown and a substrate and an extreme temperature rise;

(b) The energy of each particle incident on the substrate is low;

(c) The ionization ratio of plasma must be maintained at a high value;

(d) The discharge in a gas under a low pressure can be carried out; and (e) The efficiency of the deposition of atoms or ions sputtered from the target over the surface of the substrate must be high.

In like manner, the conventional sputtering type ion source technique cannot simultaneously satisfy the following conditions:

(a) a high yield (high density and large area);
(b) high plasma generation efficiency;
(c) high ion extraction efficiency;
(d) a high purity of ions;
(e) easy control of ion energy;
(f) capability of extracting ions from almost all materials including materials having a high melting point, metals and so on;
(g) exclusion of a heating and evaporating step in the ion generation process; and
(h) capability of extracting ions in a stable manner for a long period of time.

With the conventional sputtering type ion source utilizing ECR plasma, the ions of metals or materials having a high melting point can not be extracted and ion extraction can be continued for a long period of time in a stable manner.

SUMMARY OF THE INVENTION

In view of the above, one of the objects of the present invention is to provide a thin film forming apparatus which can substantially solve the above and other problems encountered in the conventional thin film forming apparatuses, can carry out the sputtering process by utilizing high-density ECR plasma generated at a low gas pressure and can continuously form a high quality thin film on a substrate maintained at a low temperature, at a high deposition rate and at a high efficiency without causing any damage to the thin film being grown and the substrate by sputtered particles with a high ionization rate and a low level of energy.

Another object of the present invention is to provide a sputtering type ion source utilizing ECR plasma which can extract high purity ions of almost all materials such as metals, inert gases, reactive gases and the like at a low gas pressure over a wide energy range at a high yield in a stable manner for a long period of time.

A further object o the present invention is to provide an apparatus capable of generating high-density ECR plasma at a low gas pressure which can be utilized in the thin film forming apparatus and the ion source as well.

In the first aspect of the present invention, a thin film forming apparatus comprises:

a plasma generating chamber into which a gas is introduced to generate plasma; a microwave introduction window for introducing the microwave into the plasma generating chamber;

a first target and a second target made of materials to be sputtered and mounted at both end portions of interior of the plasma generating chamber, respectively, at least one of the first and second targets being in the form of a tube;

at least one power supply for applying a negative voltage to the first and second targets;

magnetic field producing means for producing the magnet field within the plasma generating chamber and producing the magnetic flux leaving from one of the first and second targets and entering the other target; and a specimen chamber communicated to the plasma generating chamber on the side of the tubular target and having a substrate holder installed therein.

Here, the plasma generating chamber may be structured in a manner that the plasma is generated by microwave electron cyclotron resonance discharge.

The microwave may be introduced into the plasma generating chamber in the direction of the axis of the plasma to be generated, and the microwave introduction window may be connected through a vacuum waveguide to the plasma generating chamber; and the vacuum waveguide may be surrounded by a yoke so that the magnetic field produced by the magnetic field producing means is absorbed, the magnetic field strength within the vacuum waveguide is decreased and the magnetic field strength is sharply changed at the boundary between the vacuum waveguide and the plasma generating chamber.

The direction of the microwave introduction may not be parallel with the axis of the plasma to be generated.

The microwave introduction window may be located at a position which cannot be directly viewed from the first and second targets.

The tubular target may be in the form of a polygonal tube.

One of the first and second targets may be in the form of a tube while the other, in the form of a flat plate.

Both of the first and second targets may be in the form of a tube.

Specimen chambers may be communicated to both ends, respectively, of the plasma generating chamber.

The first and second targets may be the end portions, respectively, of one target in the form of a tube.

Auxiliary magnetic field producing means may be disposed in the vicinity of the substrate holder so as to control the magnetic field produced by the magnetic field producing means.

In the second aspect of the present invention, an ion source comprises:

a plasma generating chamber into which a gas is introduced to generate plasma;

a microwave introduction window for introducing the microwave into the plasma generating chamber;

an ion extraction mechanism disposed at one ends of the plasma generating chamber;

a first target and a second target made of materials to be sputtered and disposed at both end portions of the interior of the plasma generating chamber, respectively, at least one of the first and second targets being in the form of a tube;

at least one power supply for applying to the first and second targets a voltage which is negative with respect to that of the plasma generating chamber; and magnetic field producing means for producing the magnetic field and the magnetic flux leaving one of the first and second targets and entering the other target.

Here, the plasma generating chamber may be structured in a manner that the plasma is generated by microwave electron cyclotron resonance discharge.

The microwave may be introduced into the plasma generating chamber in the direction of the axis of plasma, and the microwave introduction window may be connected through a vacuum waveguide to the plasma generating chamber; and the vacuum waveguide may be surrounded by a yoke so that the magnetic field produced by the magnetic field producing means is absorbed, the magnetic field strength within the vacuum waveguide is decreased and the magnetic field strength is sharply changed at the boundary between the vacuum waveguide and the plasma generating chamber.

The direction of the microwave introduction may not be parallel with the axis of plasma to be generated.

The microwave introduction window may be located at a position which cannot be directly viewed from the first and second targets.

The tubular target may be in the form of a polygonal tube.

One of the first and second targets may be in the form of a tube while the other, in the form of a flat plate.

Both of the first and second targets may be in the form of a tube.

Specimen chambers may be communicated to both ends, respectively, of the plasma generating chamber.

The first and second targets may be the end portions, respectively, of one target in the form of a tube.

Auxiliary magnetic field producing means may be disposed in the vicinity of the substrate holder so as to control the magnetic field produced by the magnetic field producing means.

The ion extracting mechanism may comprise two perforated grids.

The ion extracting mechanism may comprise single perforated grid.

In the third aspect of the present invention, a thin film forming apparatus comprises:

a plasma generating chamber into which a gas is introduced t generate plasma, the plasma generating chamber being structured in a manner that the plasma is generated by microwave electron cyclotron resonance discharge;

a microwave introduction window connected to the plasma generating chamber for introducing the microwave thereinto;

an ion extraction mechanism disposed at one end of the plasma generating chamber;

a first target and a second target disposed at both end portions of the interior of the plasma generating chamber, respectively, and made of materials to be sputtered, at least one of the first and second targets being in the form of a tube;

at least one power supply for applying to the first and second target a voltage which is negative with respect to that of the plasma generating chamber;

magnetic field producing means for producing the magnetic field and the magnetic flux leaving one of the first and second targets and entering the other target; and a specimen chamber connected to the plasma generating chamber and having a substrate holder installed therein.

In the fourth aspect of the present invention, a plasma generating apparatus comprises:

a plasma generating chamber into which a gas is introduced to generate plasma, the plasma generating chamber being structured in a manner that the plasma is generated by microwave electron cyclotron resonance discharge;

a microwave introduction window for introducing the microwave into the plasma generating chamber;

a first target and a second target disposed at both end portions of the interior of the plasma generating chamber, respectively, and made of materials to be sputtered, at least one of the first and second targets being in the form of a tube;

at least one power supply for applying to the first and second targets a voltage which is negative with respect of that of the plasma generating chamber; and magnetic field producing means for producing the magnetic field and the magnetic flux leaving one of the first and second targets and entering the other target.

The above and other objects, effects, features and advantages of the present invention will become more apparent from the following description of embodiments thereof taken in conjunction with the accompanying drawings.

BRIEF DESCRIPTION OF THE DRAWINGS

FIG. 4A and 4B illustrate a distribution of the magnetic field strength in the direction of the magnetic flux in the first embodiment shown in FIG. 2;

DETAILED DESCRIPTION OF PREFERRED EMBODIMENTS

Referring now to the accompanying drawings, the present invention will be described in detail hereinafter.

Figure 1:
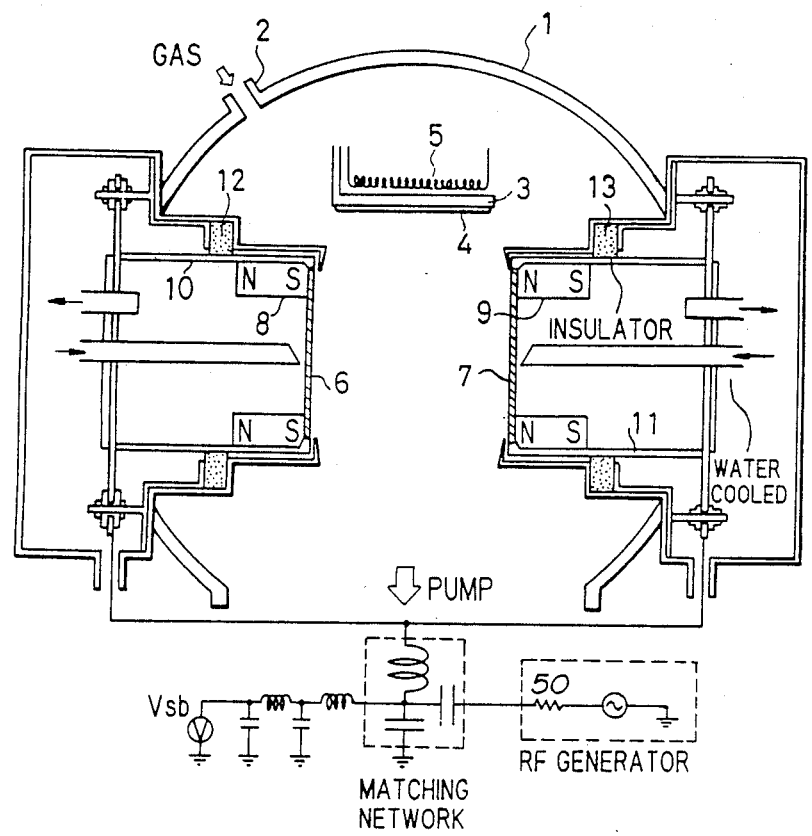
FIG. 1 is a sectional view illustrating a conventional facing target type sputtering apparatus.
Figure 2:
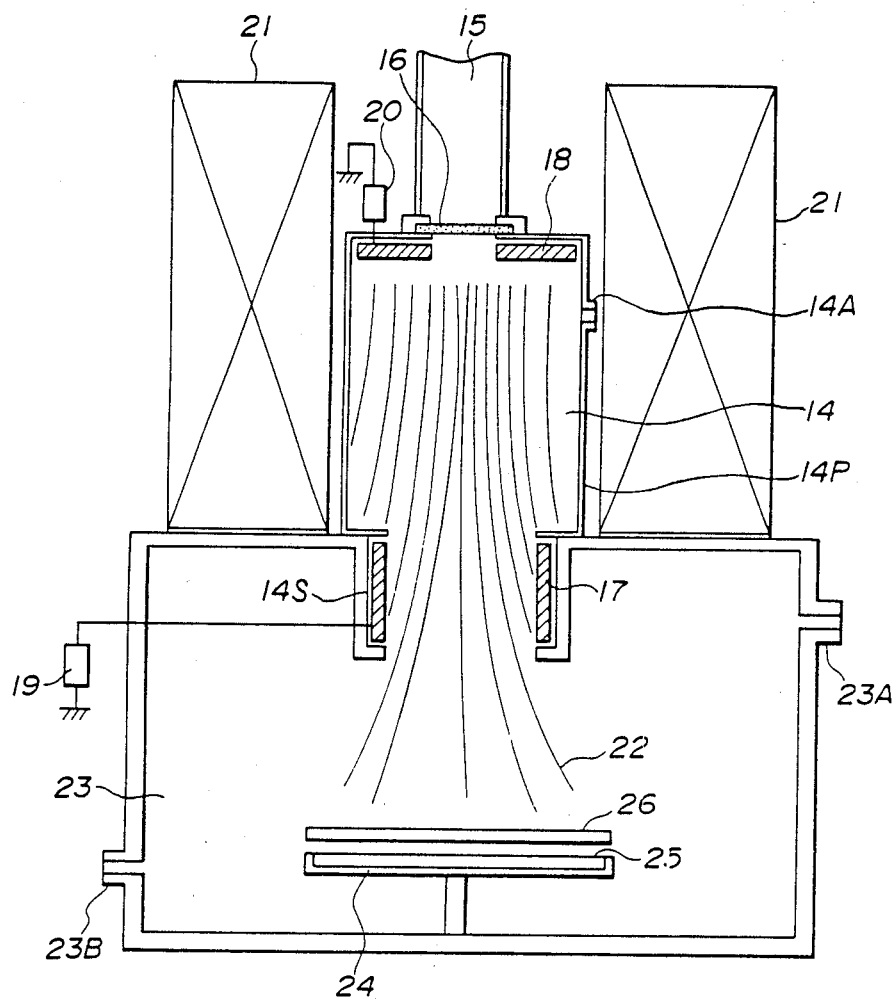
FIG. 2 is a sectional view of a first embodiment of a thin film forming apparatus in accordance with the present invention.

FIG. 2 is a sectional view illustrating a first embodiment of a thin film forming apparatus in accordance with the present invention in which a plasma generating apparatus is combined with a specimen chamber. A plasma generating chamber 14 comprises a plasma generating section 14P and a target mounting section 14S. A gas for generating plasma is introduced through a gas inlet 14A into the plasma generating chamber 14 which is also communicated with a microwave waveguide 15. The microwave is introduced from a microwave source connected to a microwave introduction mechanism composed of an oscillator, a matching device, a microwave watt meter, an isolator and so on through a microwave introduction window 16 into the plasma generation chamber 14 in the axial direction of plasma to be generated. In the first embodiment, the microwave introduction window 16 is made of a quartz glass sheet. As the microwave source is used, for instance, a magnetron with a frequency of 2.45 GHz. A tube-like target 17 is mounted on the inner surface of the target mounting section 14S. A ring-shaped target 18 is mounted within the plasma generating chamber 14 at the top portion thereof. In the first embodiment, a cylindrical target 17 is used as a tube-like target, but it is to be understood that a polygonal target may be used and that the cross section of the target 17 may be in the form of a circular or polygonal ring continuously or discontinuously extended in the circumferential direction.

Figure 3A:
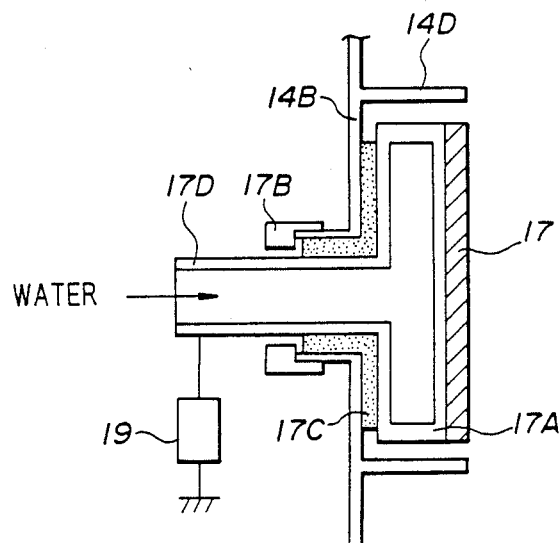
FIGS. 3A and 3B are detailed sectional views illustrating the mounting of targets.
Figure 3B:
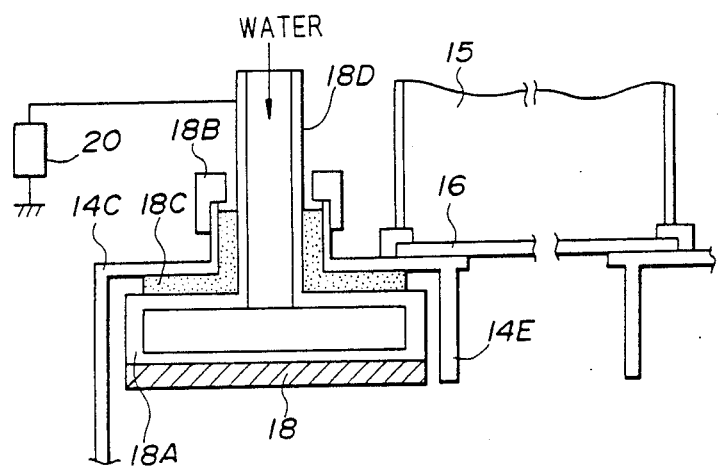

FIGS. 3A and 3B illustrate the method for mounting the targets 17 and 18 in the plasma generating chamber. As shown, the target 17 is removably mounted on a target mount 17A made of a metal. Target mount 17A may be water cooled and is securely attached with an internally threaded cap 17B to a side wall 14B of the plasma generating chamber 14. An insulator 17C is interposed between the target mount 17A and the side wall 14B. In like manner, the target 18 is removably mounted on a target mount 18A made of a metal. Target mount 18A may be water cooled, and is securely attached through an insulator 18C to the wall 14C with an internally threaded cap 18B. The horizontally and vertically extended portions 17D and 18D of the target mounts 17A and 18A also serve as electrodes which are electrically connected to DC power supplies 19 and 20, respectively, so that the negative voltages can be applied to the targets 17 and 18, respectively.

The plasma generating section 17P uses, for instance, a circular cavity resonance mode $TE_{113}$ which is one of the conditions of the microwave cavity resonator. That is, it is in the form of a cylinder 20 cm in inner diameter and 20 cm in height in order to increase not only the electric field strength of the microwave but also the efficiency of the microwave discharge. The bottom of the plasma generating section 14P; that is, the interface between the section 14P and the target mounting section 14S has an opening 10 cm in diameter. The interface acts as a reflecting surface for the microwave. The plasma generating section 14P functions as a cavity resonator.

The plasma generating chamber 14 is surrounded with at least one electromagnet 21 which produces a magnetic field in the chamber 14. In this case, various construction conditions are so determined that the conditions for producing the electron cyclotron resonance by the microwave may be satisfied within the plasma generating section 14P. For instance, the ECR condition for the microwave at the frequency of 2.45 GHz is the magnetic flux density of 875 G so that the electromagnet 21 is so designed and constructed as to attain, for instance, the maximum density of 2000 G and the magnetic flux density 875 G is obtainable anywhere within the plasma generating section 14P. Within the plasma generating section 14P, the energy is imparted to the electrons at a high efficiency and the magnetic field established within the section 14P prevents the produced ions and electrons from scattering in the direction perpendicular to the magnetic field so that high-density plasma is generated at a low gas pressure. The cylindrical target 17 and the ring-shaped target 18 are so disposed that the magnetic flux 22 from the electromagnet 21 enters the surfaces of the targets 17 and 18 and furthermore the magnetic flux leaves one target and enters the other target.

It is preferable that the plasma generating chamber is so designed and constructed that it may be cooled with water and that in order to protect the side surfaces of the targets 17 and 18 from plasma, they are surrounded by shields 14D and 14E, respectively, which are extended horizontally and vertically, respectively, from the inner wall surfaces of the plasma generating chamber 14.

After the plasma generating chamber 14 is evacuated to a high vacuum, a gas is introduced through the gas inlet 14A into the plasma generating chamber 14 while the microwave is introduced therein and the discharge is effected under the ECR condition to generate high-density plasma. The magnetic flux extended between two targets serves to prevent the secondary electrons ($\gamma$ electrons) emitted from the surfaces of the targets from scattering in the direction perpendicular to the magnetic field and furthermore to confine plasma. As a result, high-density plasma is generated at a low gas pressure. Plasma thus generated sputters the targets so as to knock-on ions and neutral particles. The knocked-on ions and neutral particles are extracted as sputtered particles. The bottom of the plasma generating chamber 14 is communicated with the specimen chamber 23 into which can be introduced a gas through a gas inlet 23A and which can be evacuated to a high vacuum by an exhaust system via gas outlet 23B. Within the specimen chamber is disposed a substrate holder 24 which supports a substrate 25, and a shutter 26 which can be opened or closed is disposed above the substrate holder 24. In the other embodiments to be described hereinafter, sometimes the shutter 26 is not shown. It is preferable that a heating element is embedded into the substrate holder 24 for heating the same and that a DC or AC voltage is applied to the substrate 25 so that the bias voltages can be applied to the substrate 25 upon which a thin film is being grown and the substrate can be cleaned by sputtering.

FIG. 4 illustrates a distribution of the magnetic field strength in the direction of the magnetic flux in the first embodiment shown in FIG. 2. The magnetic field is a diverging magnetic field.

Figure 5:
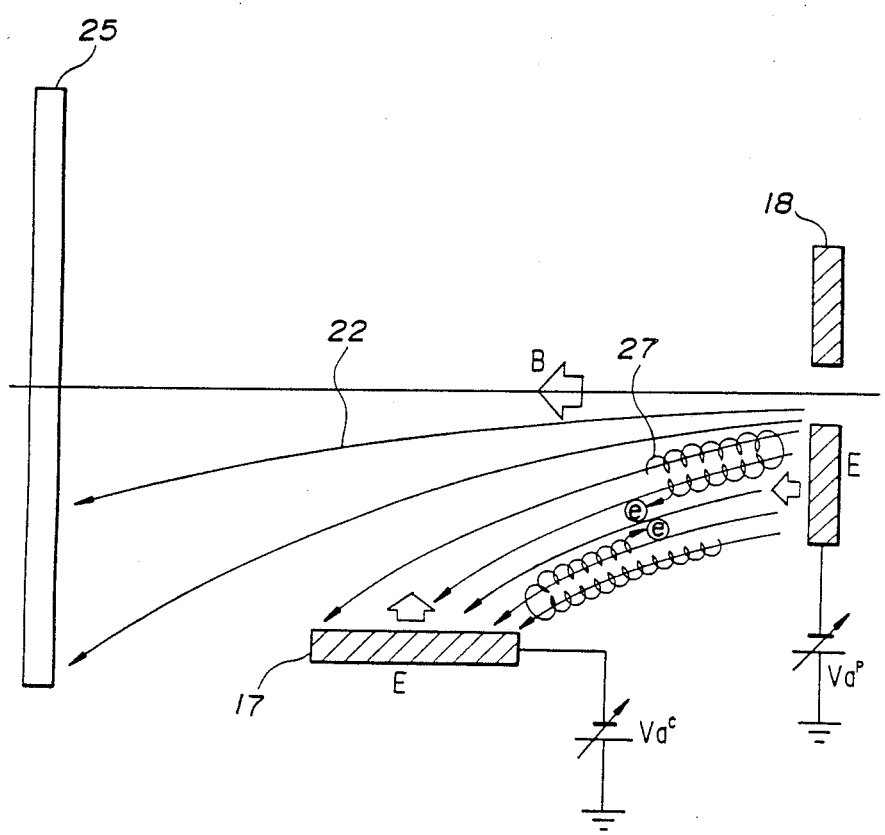
FIG. 5 is a view used to explain the movement of high-energy secondary electrons (γelectrons) in the first embodiment.

Referring next to FIG. 5, the plasma breeding mechanism in the first embodiment will be described. A gas is introduced into the plasma generating chamber and is generated the plasma under ECR condition. As described above the ring-shaped target 18 which is water cooled is mounted in the vicinity of the top of the plasma generating chamber within the latter and the cylindrical target 17 which is also water cooled is mounted at the outlet of the plasma generating chamber communicated with the specimen chamber so as to surround generated plasma.

The microwave introduction window 16 is disposed at the center of the ring-shaped target 18 so that the microwave is introduced through the center of the ring-shaped target 18 into the plasma generating chamber 14.

The first embodiment is so designed and constructed that the magnetic flux 22 produced by the electromagnet 21 extends between the surfaces of the cylindrical target 17 and the ring-shaped target 18. In other words the magnetic flux leaves the surface of one target and enter the surface of the other target.

When the magnetic field is gradually varied in the space, the electrons in generated high-density plasma have the mobility which is much higher than that of ions. Electrons are confined by the magnetic flux 22 and while making spiral motion around the magnetic flux 22 and while maintaining their angular momentum, they are accelerated toward in the direction of the target depending upon the gradient of the magnetic field. When the negative voltage $Va^c$ and $Va^p$ are applied to the cylindrical target 17 and the ring-shaped target 18, respectively, which are now exposed to high-density plasma generated in the manner described above, the ions in high-density plasma are efficiently attracted to the cylindrical target 17 and the ring-shaped target 18 to sputter targets. When the ions impinge upon the surfaces of the targets, the secondary electrons ($\gamma$ electrons) 27 are emitted from the surfaces thereof. The secondary electrons 27 are accelerated by the electric fields produced by the targets, are confined by the magnetic flux and move with high-energy toward the opposite target while making spiral motion. The secondary electrons which have reached the opposite target ar reflected by the electric field produced thereby. As a result, the secondary electrons 27 are confined between the targets while making spiral motion. Thus reciprocally moving secondary electrons are confined until their energy become lower than the constraining force of the magnetic flux, and while they are confined, the ionization is accelerated by the collisions wit the neutral particles and by the interaction with plasma.

Since plasma is active, not only the stable discharge can be maintained at a low gass pressure of the order of $10^{-5}$ Torr, but also even at a relatively high gas pressure in which an active species plays an important roll, a thin film having a better crystal structures can be grown by the active plasma action on the substrate at a low temperature.

In the thin film forming apparatus in accordance with the present invention, since the ionization rate of plasma is high as described above, the ratio of the ionization of the sputtered particles in plasma is high. Hence, the so-called self-sputtering, that is, the repetitive sputtering of the target with the ionized particles which are sputtered and are accelerated again by the potential applied to the target becomes extremely high. That is, the present invention has a feature that even when a gas for generating plasma (for instance, Ar) is very thin or even when no gas is used, the above-mentioned self-sputtering is continued so that a highly pure thin film can be formed.

Next, the results of the formation of an AlN film by the thin film forming apparatus in accordance with the present invention will be described. After the specimen chamber 23 was evacuated to a vacuum of $5 \times 10^{-7}$ Torr, the nitrogen ($N_2$) was introduced at a rate of 2 cc/min and the gas pressure in the plasma generating chamber 14 was maintained at $3 \times 10^{-4}$ Torr. A thin film as grown under the condition that the power of the introduced microwave was 100-500 W, the power applied to the Al target 17 was 100-800 W and the substrate holder was heated at 300° C. The result was that AlN films were deposited at a deposition rate of 3-40 nm/min in a stable and efficient manner for a long period of time.

Figure 6:
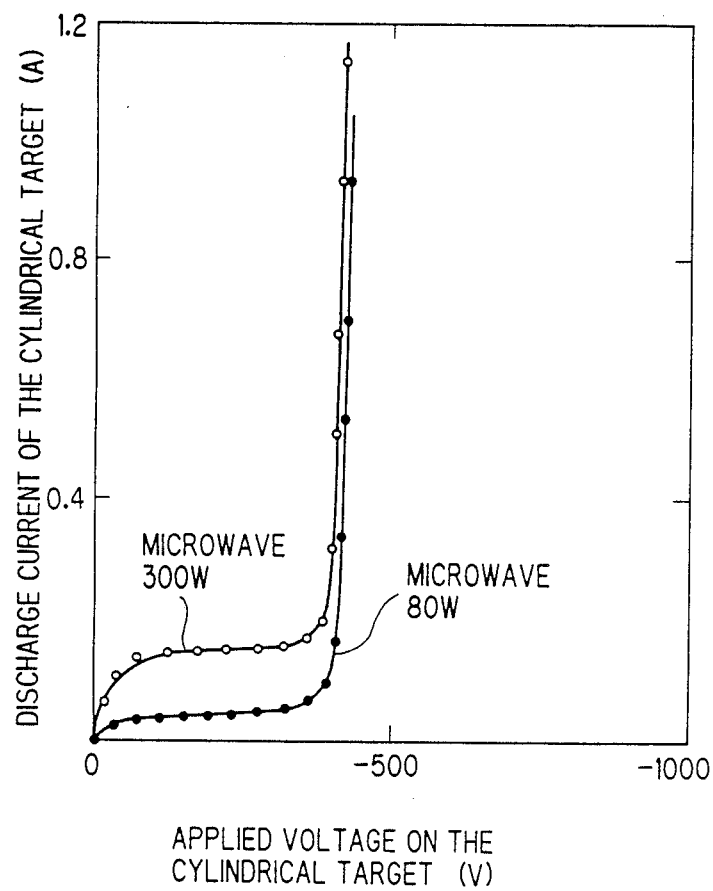
FIG. 6 illustrates discharge characteristics of the first embodiment.

FIG. 6 illustrates a discharge characteristic of the first embodiment when the voltage applied to the ring-shaped target was maintained at $-500$ V; the pressure of nitrogen gas was maintained at $3 \times 10^{-3}$ Torr; and the microwave power was maintained at 300 W and 80 W. According to the first embodiment, even when the voltages applied to the cylindrical target 17 and the ring-shaped target 18, respectively, are different from each other sufficiently high-density plasma was generated. Furthermore even when the same voltage is applied to both the targets; that is, even when the targets are electrically connected to each other, high-density plasma could be generated at a considerably high degree of efficiency. The deposition rate increased linealy with the applied power. In the experiments, the mean energy of ions was varied from 5 eV to 30 eV.

The thin film forming apparatus in accordance with the present invention is not limited to the formation of the AlN films and can be utilized to form the thin films of almost all materials. Furthermore, the gas to be introduced into the plasma generating chamber is not limited to the nitrogen gas and almost all the reactive gases may be used so that repetitive sputtering can be accomplished. In addition, various compounds may be used as targets so that thin films of almost all the materials can be formed.

Figure 7:
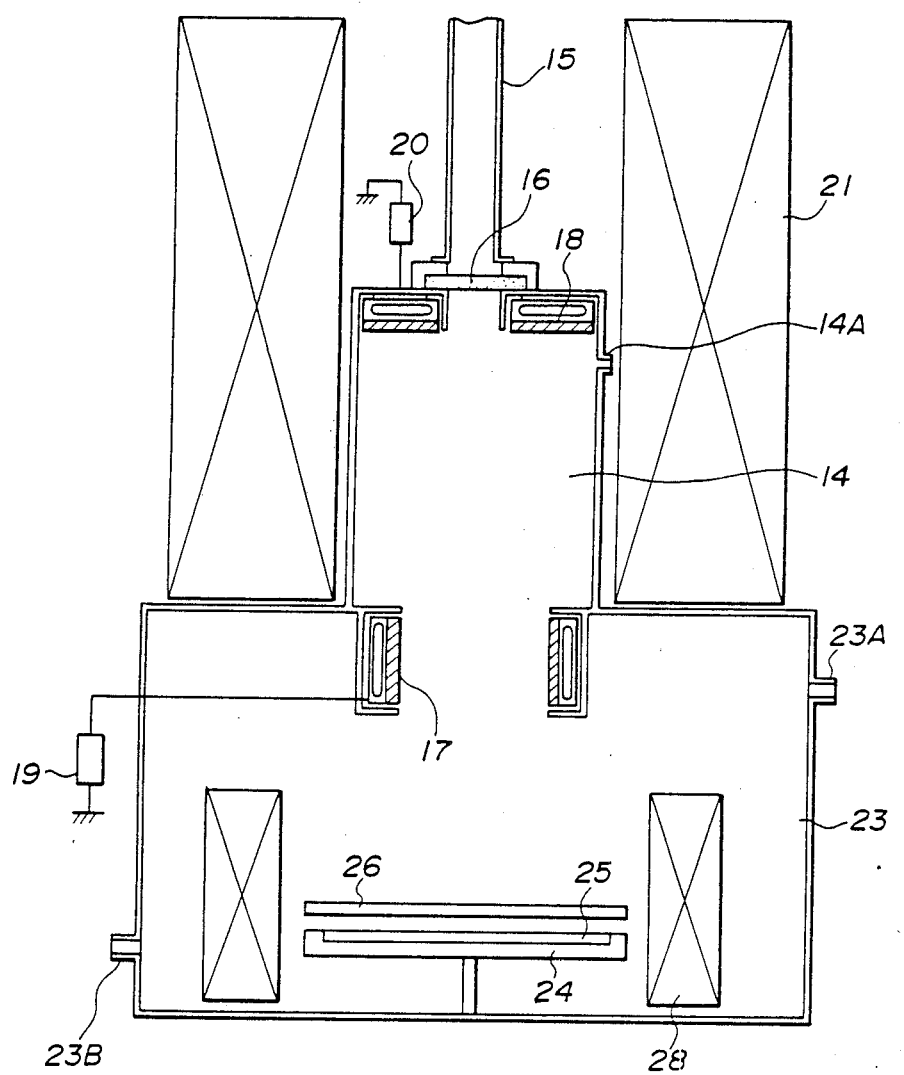
FIG. 7 is a sectional view illustrating a second embodiment of a thin film forming apparatus in accordance with the present invention.

Referring next to FIG. 7, a second embodiment of a thin film forming apparatus in accordance with the present invention will be described. The gradient of the magnetic field established by the electromagnet 21 greatly influences the energy of each ion accelerated in the direction of the substrate, the distribution of erosion of the target or the shape of plasma. According to the second embodiment, an auxiliary electromagnet 28 is additionally provided around the substrate in order to control the gradient of the magnetic field, thereby controlling the above-mentioned factors influenced by the gradient of the magnetic field of the electromagnet 21.

Figure 8:
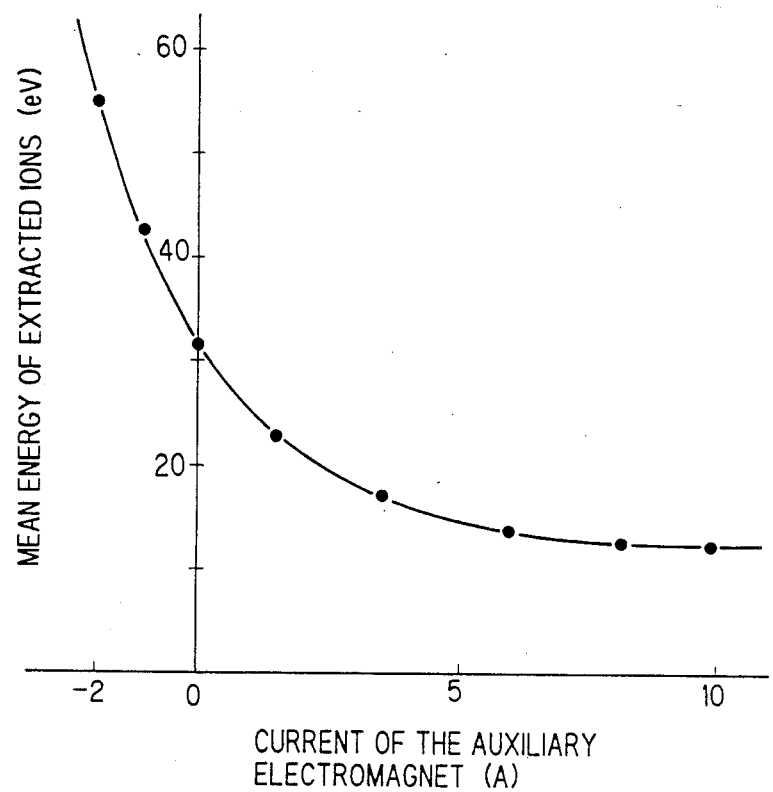
FIG. 8 illustrates the relationship between the current flowing through an auxiliary electromagnet and the mean ion energy.

FIG. 8 illustrates the variation in mean ion energy when the magnitude of current flowing through the auxiliary electromagnet 28 is varied. In FIG. 8 the positive current corresponds the case in which the direction of the magnetic field produced by the auxiliary electromagnet is the same with the direction of the magnetic field produced by the electromagnet 21, but the negative current corresponds to the case in which the direction of the magnetic field produced by the auxiliary electromagnet is opposite to the direction of the magnetic field produced by the magnet 21.

Figure 9:
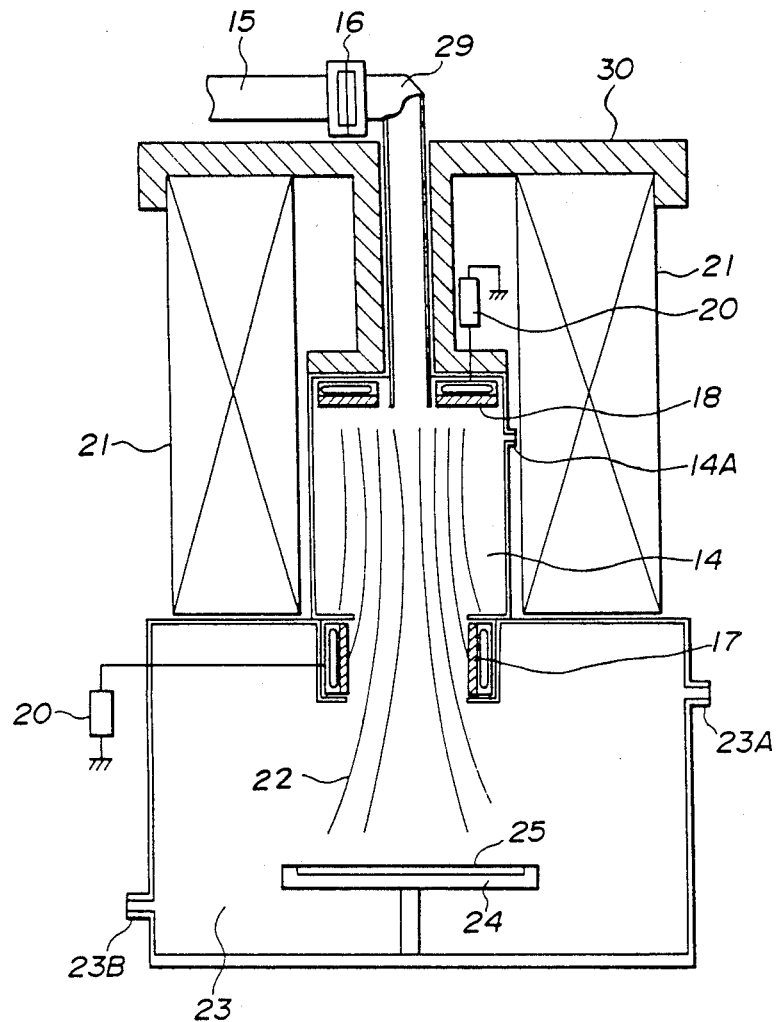
FIG. 9 is a sectional view illustrating a third embodiment of the present invention.

Referring next to FIG. 9, a third embodiment of the present invention will be described. In the third embodiment, the microwave introduction window 16 is connected through a vacuum waveguide 29 to the plasma generating chamber 14. The vacuum waveguide 29 interconnecting between the center portion of the ring-shaped target 18 and the plasma generating chamber 14 is surrounded by a yoke 30 so that the magnetic flux in the vacuum waveguide 29 can be absorbed and the magnetic field strength can be sharply varied at the portion connecting the vacuum waveguide 29 with the plasma generating chamber 14.

Figure 10A:
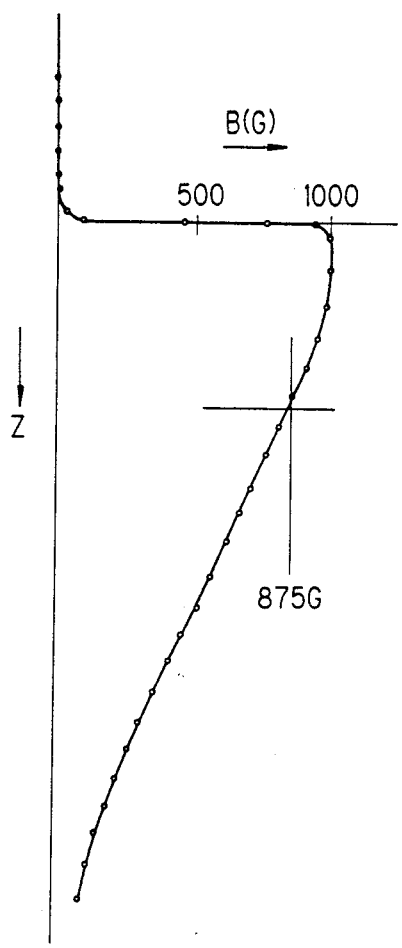
FIG. 10A and 10B illustrate a distribution of the magnetic field strength in the direction of the magnetic flux in the third embodiment.
Figure 10B:
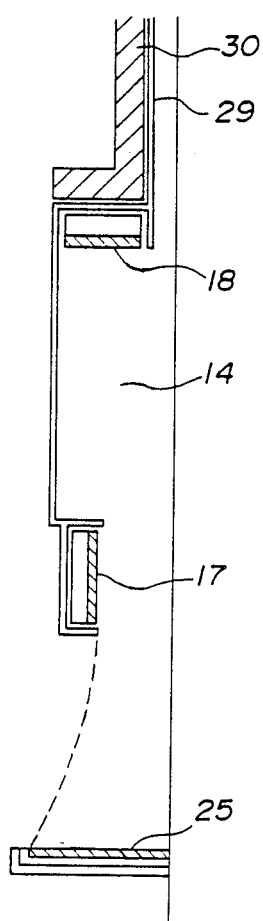

FIG. 10 illustrates a distribution of the magnet field strength in the direction of the magnetic flux in the third embodiment. The plasma breeding mechanism in the third embodiment is substantially similar to that described above with reference to FIG. 5.

The functions of the vacuum waveguide and the yoke are as follows. That is, in the case of the formation of an electrically conductive thin film, when the microwave introduction window 16 becomes dim or is contaminated, it becomes impossible to generate plasma for a long period o time. When only the microwave introduction window 16 is spaced apart from the plasma generating chamber and is connected thereto through the vacuum waveguide 29, the resonance condition is satisfied even in the vacuum waveguide so that plasma is generated in the vacuum waveguide 99. Furthermore it becomes also impossible to supply the microwave power effectively because the plasma is accelerated in the direction in which the microwave is introduced. However, when the vacuum waveguide 29 which is connected to the plasma generating chamber 14 is surrounded by the yoke 30, the magnetic flux in the vacuum waveguide 29 is reduced and the magnetic field strength sharply changes at the boundary between the plasma generating chamber 14 and the vacuum waveguide 29 so that no plasma is generated in the vacuum waveguide and is accelerated in the direction thereof. In other words, plasma is not accelerated in the direction of the microwave introduction. Meanwhile, of the particles sputtered from the cylindrical target 17 and the ring-shaped target 18 mounted in the plasma generating chamber 14, the neutral particles which are not ionized are not influenced by the magnetic field and the electrical field so that they fly substantially straightly from the targets. Thus, when the microwave window 16 is located at a position at which the window 16 is not directly viewed from the targets, the contamination of the microwave introduction window 16 with the sputtered particles can be prevented. Thus, regardless of the conductivity of a thin film being grown and the thickness thereof, the contamination of the microwave introduction window 16 is prevented. Therefore it becomes possible to form a thin film of almost any material can be formed continuously in a stable manner for a long period of time.

Next the results of the formation of Al films by utilizing the third embodiment will be described. The specimen chamber 23 is evacuated to a vacuum of $5 \times 10^{-7}$ Torr and then Ar gas was introduced at a rate of 2 cc/min. The gas pressure in the plasma generating chamber 14 was maintained at $3 \times 10^{-4}$ Torr and a thin film was formed under the condition that the microwave power was maintained at 100–500 W; the power supplied to the Al target 17 was 100–800 W; and the substrate holder 24 was not heated and was maintained at room temperature. The Al films were formed at a deposition rate of 10–150 nm/min continuously in a stable and efficient manner for a long period of time.

Figure 11:
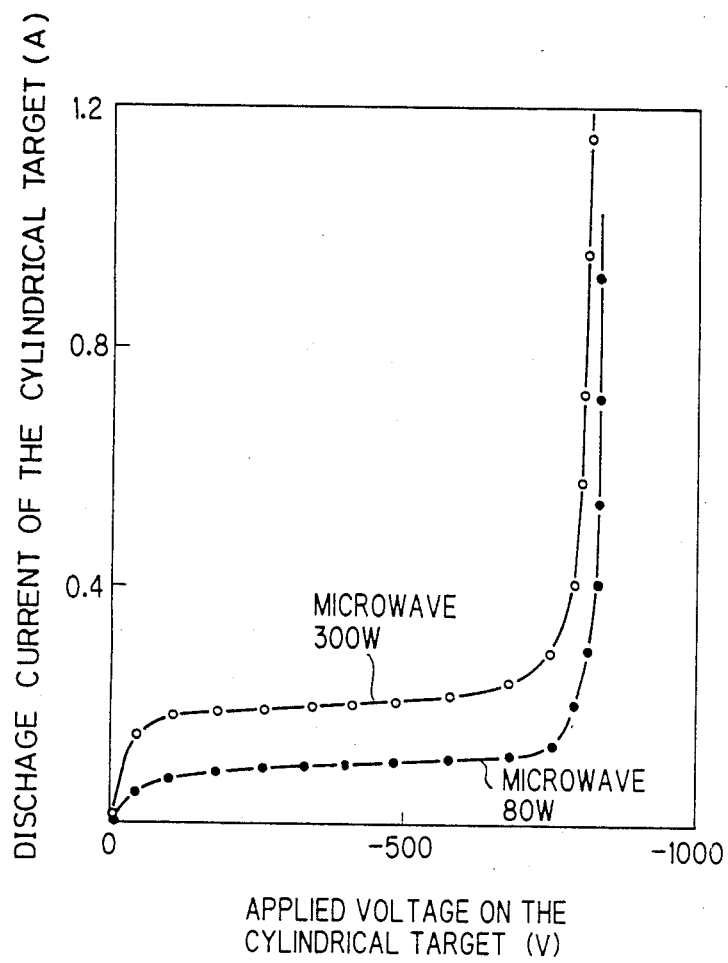
FIG. 11 illustrates a discharge characteristics of the third embodiment shown in FIG. 9.
Figure 12:
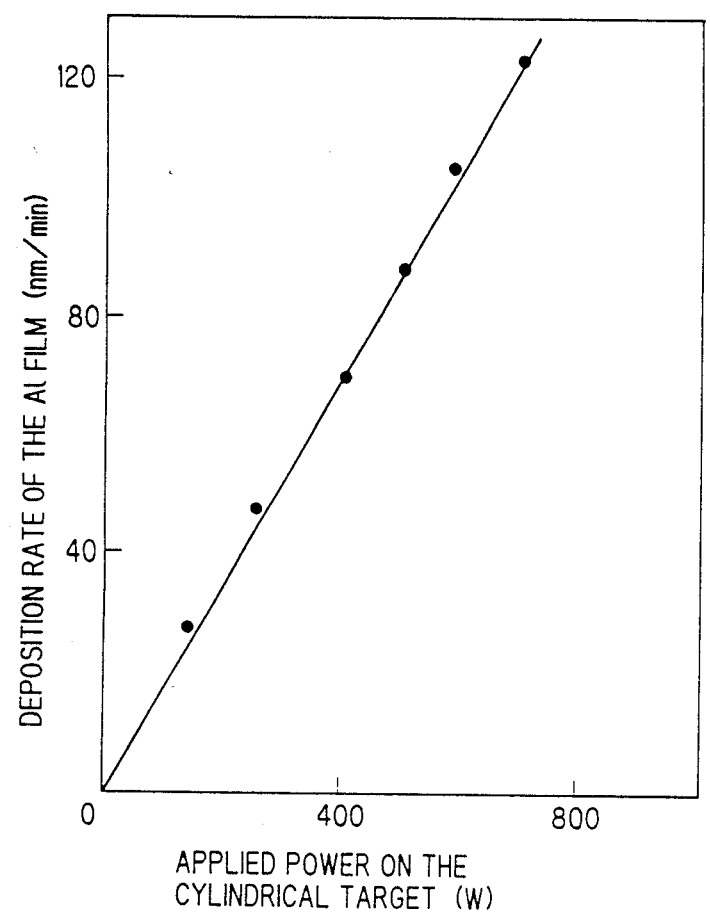
FIG. 12 illustrates the dependence of the deposition rate on the power supplied to the target.

FIG. 11 illustrates a discharge characteristic of the third embodiment. In this case, the voltage applied to the ring-shaped target 18 was maintained at −500 V; the Ar gas pressure was maintained at $3 \times 10^{-4}$ Torr; and the microwave power was maintained at 300 W and at 80 W. According to the third embodiment, even when the voltages applied to the cylindrical target 17 and the ring-shaped target 18 are different, sufficiently high density plasma can be generated. Furthermore when the same voltage is applied to both targets; that is even when the targets are electrically connected to each other, sufficiently high density plasma can be generate. In both cases, the mean energy of ions varies from 5 eV to 30 eV. FIG. 12 illustrates the dependence of the deposition rate or the film growth rate on the power supplied to the target. The deposition rate increased with the supplying power.

Like the second embodiment shown in FIG. 7, in the third embodiment the auxiliary electromagnet 28 for controlling the gradient of the magnetic field can be provided to surround the sides of the substrate so that the energy of each ion accelerated in the direction of the substrate, an erosion distribution of the target or the shape of plasma, all of which are influenced by the gradient of the magnetic field, can be controlled.

Figure 13:
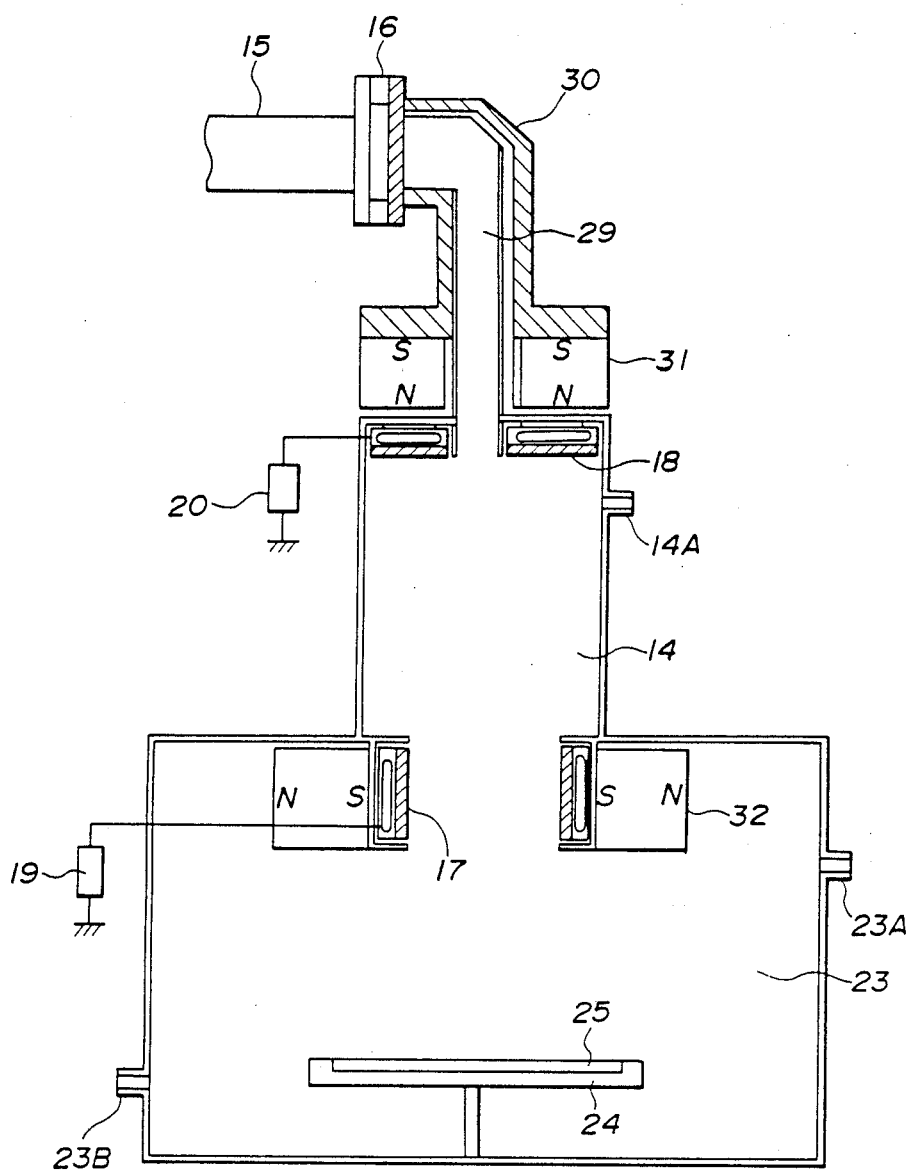
FIG. 13 is a sectional view of a fourth embodiment of the present invention.

Referring next to FIG. 13, a fourth embodiment of the present invention will be described. The fourth embodiment is substantially similar in construction to the first embodiment described above with reference to FIG. 2 except that the electromagnet 21 is replaced by two ring-shaped permanent magnets 31 and 32. It is to be understood that instead of the ring-shaped permanent magnets 31 and 32, a plurality of bar magnets which are arranged radially may be used. In the third embodiment shown in FIG. 9, it may be also possible to replace the electromagnet 21 by one or more permanent magnets. In the case in which the electromagnet is replaced by one or more permanent magnets, when one or more permanent magnets are so designed, constructed and disposed in such a way that a predetermined magnetic field strength is produced by the permanent magnets and the magnetic flux leaves one target and enters the other target, the mode of operation of the fourth embodiment is substantially similar to those of the above-described embodiments. Furthermore one or more permanent magnets can be used in combination with the yoke 30 described above.

Figure 14:
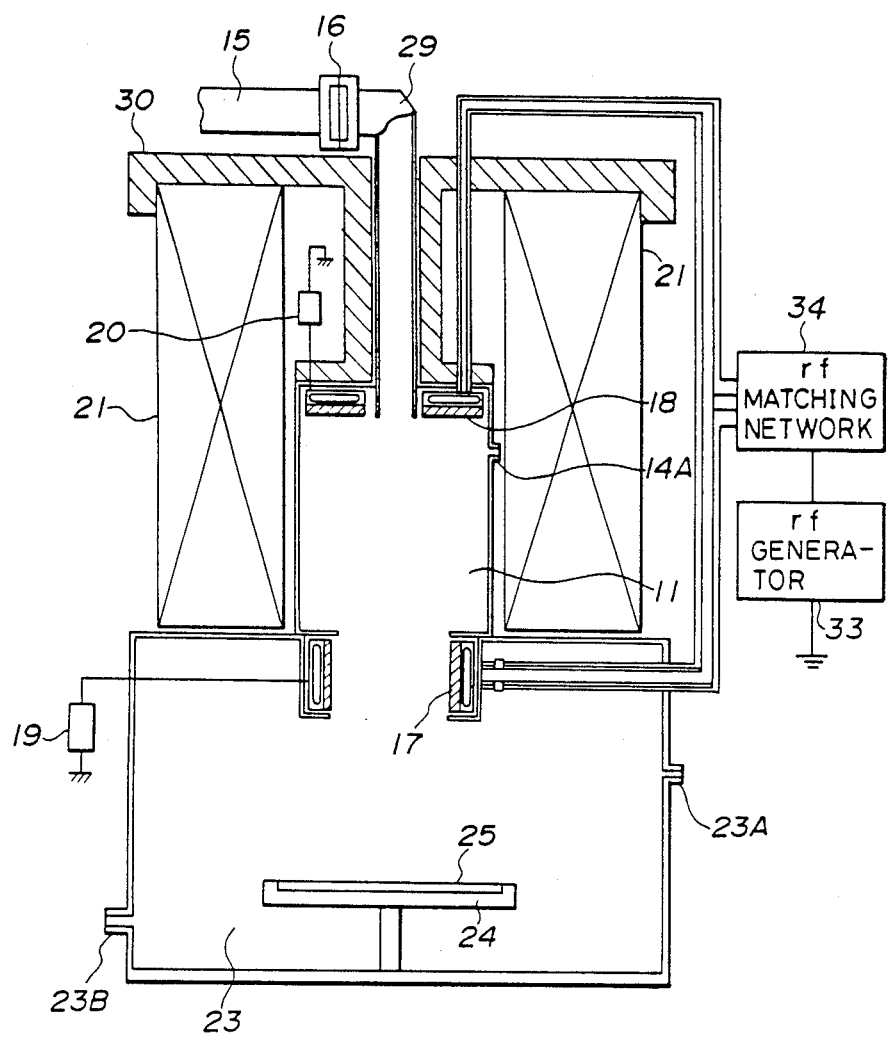
FIG. 14 is a sectional view illustrating a fifth embodiment of the present invention.

FIG. 14 illustrates a fifth embodiment of the present invention which is substantially similar in construction to the third embodiment described above with reference to FIG. 9 except that the voltages applied to the targets are replaced by high frequency power. That is, when rf power from a rf generator 33 is applied through a matching network 34 to the targets 17 and 18, the effects substantially similar to those attained by the above-described embodiments can be attained. Furthermore, the fifth embodiment has a feature that even when the targets are not electrically conductive, the sputtering can be carried out effectively. It is of course apparent that the high frequency power may be supplied to the targets in the first embodiment described above with reference to FIG. 2.

Figures 15A, 15B:
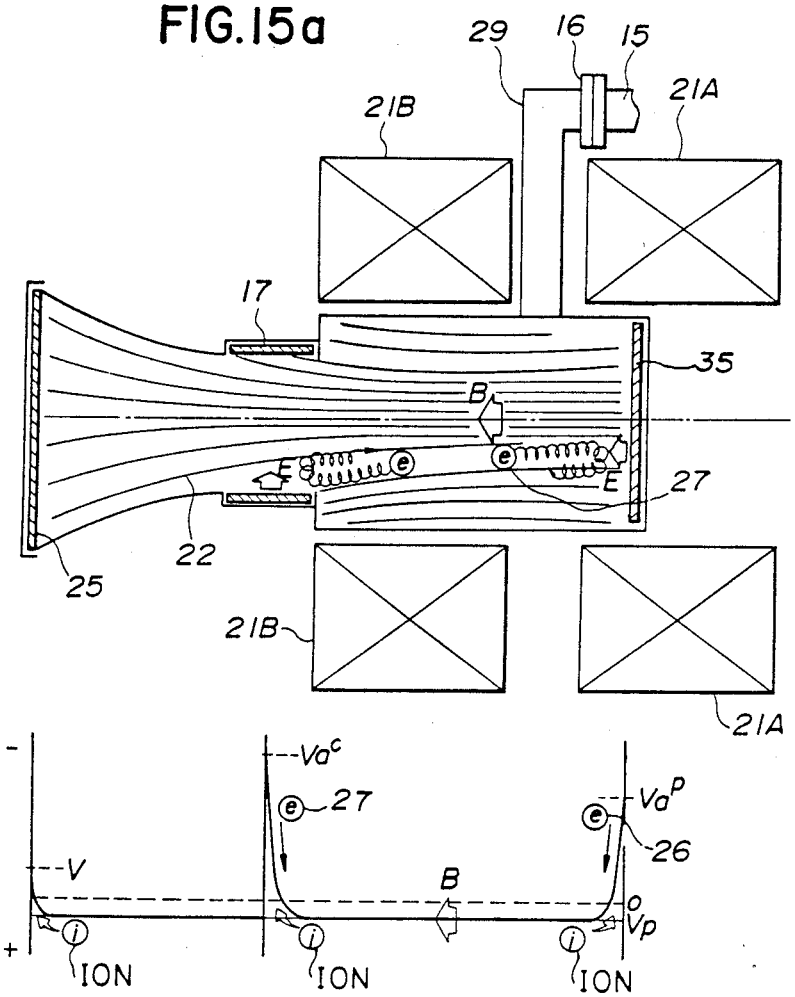
FIG. 15A and 15B are views illustrating the schematic construction of and a potential distribution in the sixth embodiment of the present invention.
Figure 16:
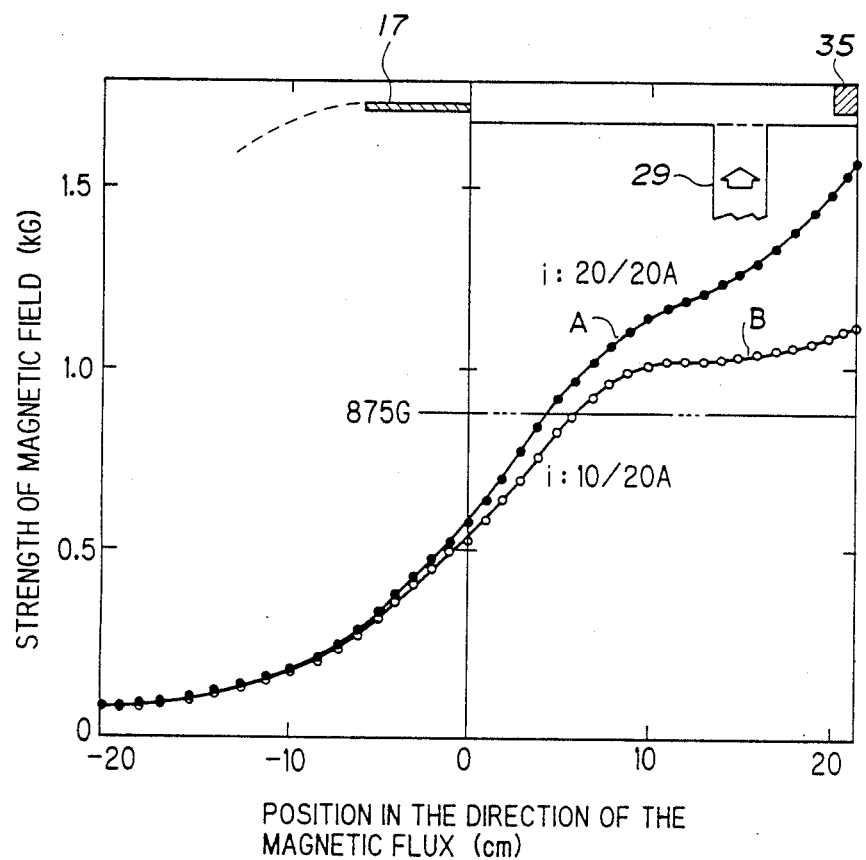
FIG. 16 illustrates a distribution of the magnetic field strength in the direction of the magnetic flux in the sixth embodiment.

FIG. 15 schematically illustrates the construction of and the potential distribution in the direction of the magnetic flux in a sixth embodiment of the present invention. The essential difference from the first embodiment described above with reference to FIG. 2 is that the microwave is introduced into the plasma generating chamber 14 in the direction perpendicular to the axis of plasma to be generated or the magnetic flux at the center axis of the plasma generating chamber. That is, one end of the vacuum waveguide 29 is connected to the plasma generating chamber 14 perpendicular to the wall thereof and the other end of the vacuum waveguide 29 is connected through the microwave introduction window 16 to a microwave waveguide which in turn is connected to a microwave source (not shown). The microwave introduction window 16 is disposed at a position which cannot be viewed directly from the targets. Because of the modification of the microwave introduction system as described above, the electromagnet 21 of the first embodiment (FIG. 2) is replaced by two electromagnets 21A and 21B. The magnetic fields produced by the electromagnets 21A and 21B, respectively, may be symmetrical or may be asymmetrical with each other. And the enter hole, through which microwave is introduced, of the ring-shaped target is not needed, thus a planar target 35 may be used instead of the ring-shaped target 18. The electromagnets 21A and 21B are so arranged that the magnetic field sufficient to cause ECR is produced and the magnetic flux leaves from one of the targets 17 and 3 and enters the other target within the plasma generating chamber 14. The sputtered particles are deposited on the substrate 25. FIG. 16 illustrates a distribution of the magnetic field strength in the direction of the magnetic flux. Curve A is the distribution when the currents flowing through electromagnets 21A and 21B are 20A and 20A respectively, while curve B is that when the currents are 10A and 20A respectively. The magnetic field is a diverging magnetic field.

A gas is introduced into the plasma generating chamber 14 and plasma is generated under the ECR condition. High-density plasma can be generated according to the plasma breeding mechanism described above with reference to FIG. 5. When the negative voltages $Va^c$ and $Va^p$ are applied to the cylindrical target 17 and the planar target 35, respectively, exposed to high-density plasma thus generated, the ions in high-density plasma can be efficiently attracted to sputter the cylindrical target 17 and the planar target 35.

In the sixth embodiment, the vacuum waveguide 29 is connected to the plasma generating chamber 14 in the direction perpendicular to the magnetic flux so that plasma is not accelerated in the direction of the introduction of the microwave. Of the sputtered particles from the cylindrical target 17 and the planar target 35 mounted in the plasma generating chamber, the neutral particles fly substantially straightly from the targets. However since the microwave introduction window 16 is located at a position which cannot be directly viewed from the targets, the contamination of the microwave introduction window 16 with the sputtered particles can be prevented. As described above, regardless whether or not a thin film being grown is electrically conductive or of the thickness of a thin film being grown, the microwave introduction window 16 is prevented from becoming dim so that a thin film of almost any material can be formed continuously in a stable manner for a long period of time.

From the standpoint of the efficiency of the introduction of the microwave, it is preferable that the magnetic field strength at the portion of the plasma generating chamber 14 where the microwave is introduced is made stronger than the magnetic field strength for inducing ECR, 875 G, in this case.

Next the results of the formation of the Al films by utilizing the sixth embodiment will be described. After the specimen chamber 23 is evacuated to a vacuum of $5 \times 10^{-7}$ Torr, Ar gas is introduced at a rate of 2 cc/min and the gas pressure in the plasma generating chamber 14 was maintained at $3 \times 10^{-4}$ Torr. The formation of the Al films was carried out under the conditions that the microwave power was between 100 and 500 W and the power supplied to the cylindrical Al target 17 was between 100 and 800 W and the substrate holder temperature was maintained at room temperature. The results showed that the Al thin films can be continuously formed at a deposition rate of 10-150 nm/min in a stable and efficient manner for a long period of time. In the experiments, the mean energy of each ion was varied between 5 and 30 eV.

Figure 17:
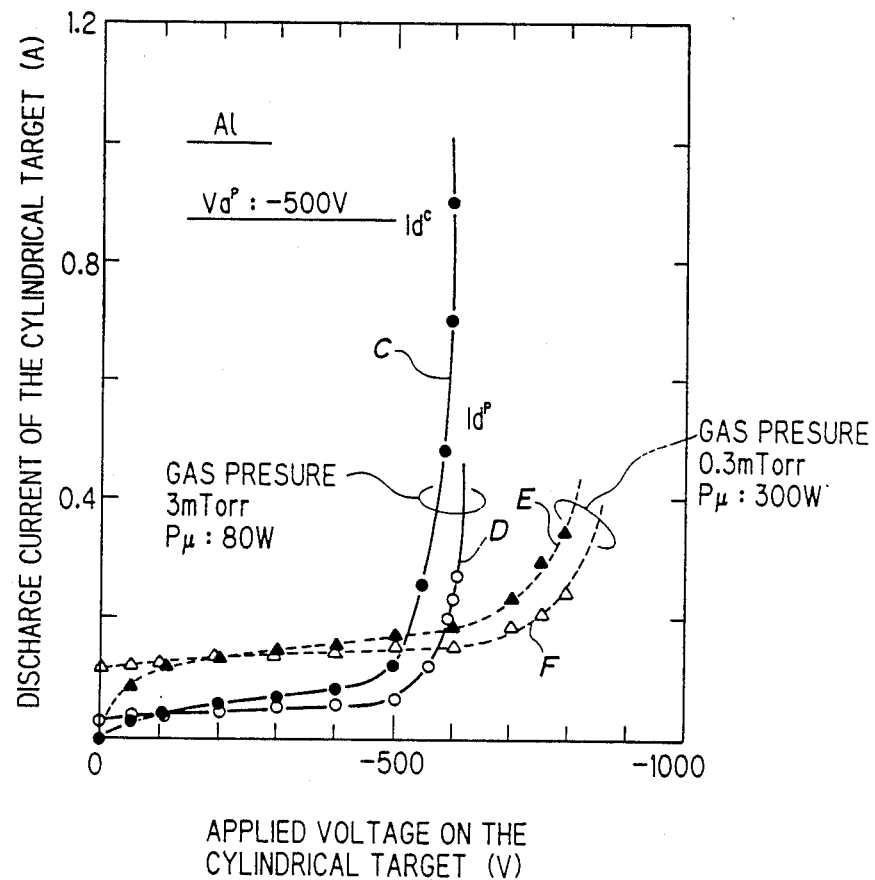
FIG. 17 illustrates a discharge characteristics in the sixth embodiment shown in FIG. 15.

FIG. 17 illustrates the discharge characteristic of the sixth embodiment under the conditions that the voltage applied to the planar target was $-500$ V; Ar gas pressure was maintained at 0.3 and 3 m Torr; and the microwave power was maintained at 300 and 80 W. Curves C and E are discharge currents of the cylindrical target 17 and curves D and are that of the planar target 35. When the voltages applied to the cylindrical target 17 and the planar target 35 are different from each other, or when the same voltage is applied to both of the targets 17 and 35, sufficiently high-density plasma can be generated. The deposition rate of Al films increased linearly with the increase in power supplied to the target.

The apparatuses shown in FIGS. 2, 7, 9, 13, 14 and 15 can be modified in such a manner that the plasma generating chamber 14 does not comprise the target mounting section 14S and the cylindrical target 17 is mounted in the plasma generating section 14P.

Figure 18:
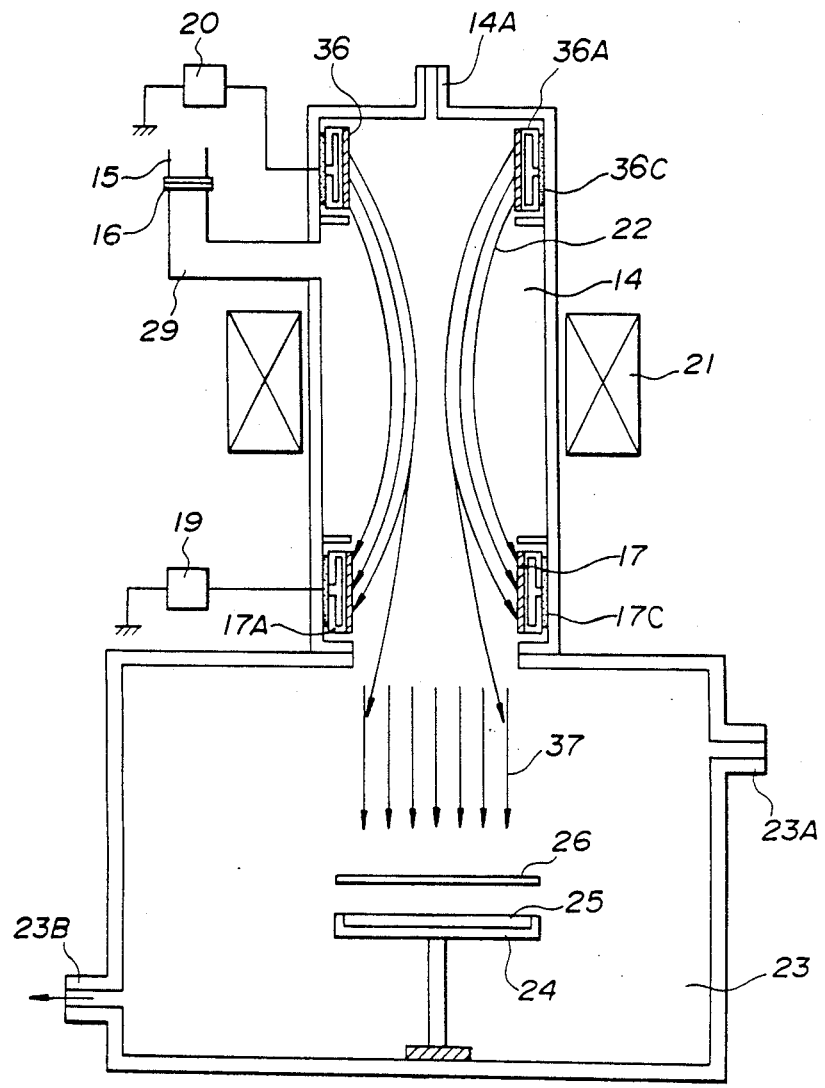
FIGS. 18-21 are sectional views illustrating a seventh, eighth, ninth and tenth embodiments, respectively, of the present invention.

FIG. 18 illustrates a seventh embodiment of the present invention. In this embodiment, the combination of the planar target and the cylindrical target is not used and instead the combination of two cylindrical magnets 17 and 36 is utilized. The magnetic flux produced by the electromagnet 21 for producing the magnetic field leaves one target and enters the other target. The target 36 is detachably mounted on a mount 36A which is made of a metal and may be water cooled and is applied with the negative voltage from a power supply 20. An insulator 36C is interposed between the target mount 36A and the inner wall surface of the plasma generating chamber 14.

In the seventh embodiment, when the high-energy ions impinge on the surfaces of the targets to which are applied the negative voltages, the high-energy secondary electrons ($\gamma$ electrons) are emitted from the surfaces of the targets 17 and 36. The $\gamma$ electrons emitted from the targets are reflected by the electric fields produced by the targets 17 and 36 and are caused to make the reciprocal motion between the targets 17 and 36 while making the cyclotron motion around the magnetic flux extended between the targets 17 and 36. Like the above-described embodiments, the seventh embodiment can generate high-density plasma even at a low gas pressure and sputtering of targets are carried out. The sputtered particles 37 are deposited on the substrate 25.

The seventh embodiment can form a thin film at a high disposition rate as in the case of the sixth embodiment described above with reference to FIG. 15. The plasma generating chamber 14 may comprise the plasma generating section and the target mounting section in which the target 17 is mounted.

Figure 19:
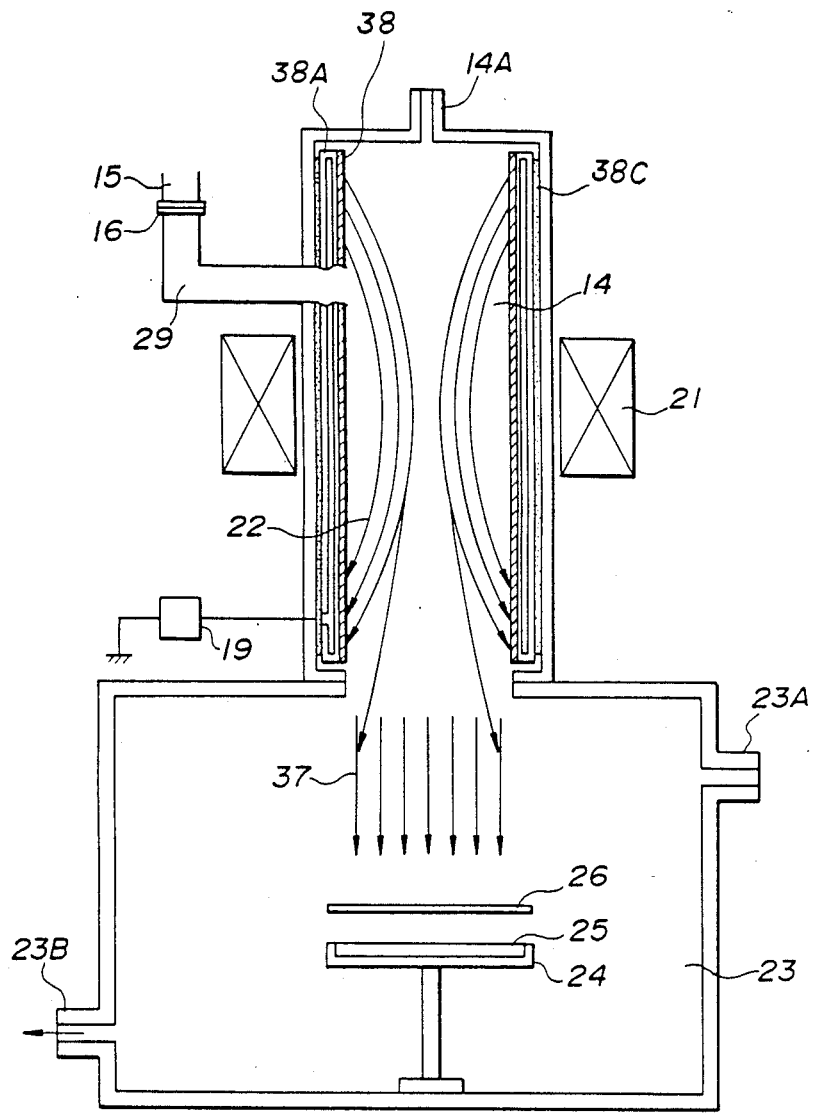

FIG. 19 illustrates an eighth embodiment of the present invention in which is mounted only one cylindrical target 38 unlike the above-described embodiments. The target 38 is mounted on a mount 38A which is made of a metal and may be cooled and is applied with a negative voltage supplied from a power supply 19. An insulator 38C is interspaced between the cylindrical target 38 and the inner surface of the plasma generating chamber 14. The magnetic flux of the electromagnet 21 leaves one end portion of the target 38 and enters the other end portion thereof. Like the sixth embodiment described above with reference to FIG. 15, the eighth embodiment can generate high-density plasma and extract sputtered particles 37 so that thin films can be formed at a high deposition rate.

Figure 20:
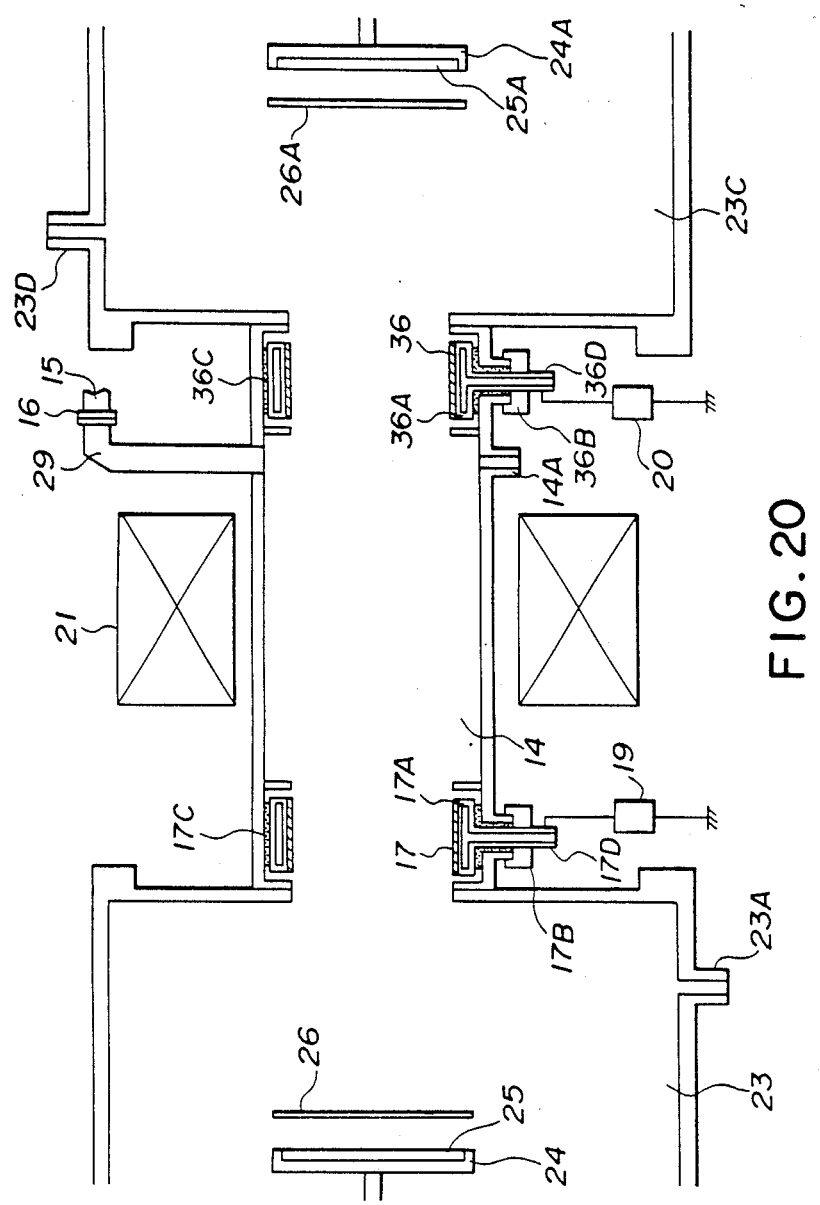

FIG. 20 illustrates in section a ninth embodiment of the present invention in which specimen chambers 23 and 23C are connected to both ends, respectively, of the plasma generating chamber 14 of the type described above with reference to FIG. 18. That is, the specimen chambers 23 and 23C are connected to the plasma generating chamber 14 in opposing relationship with each other. The specimen chamber 23C is provided with a gas inlet 23D, an exhaust system (not shown), a substrate holder 24A for supporting the substrate 25A and a shutter 26A. According to the ninth embodiment, therefore, sputtered particles are extracted from both ends of the plasma generating chamber 14, whereby thin films are formed.

In the sixth to ninth embodiments described above with reference to FIGS. 15, and 18-20, instead of the electromagnet, one or more permanent magnets may be utilized.

Figure 21:
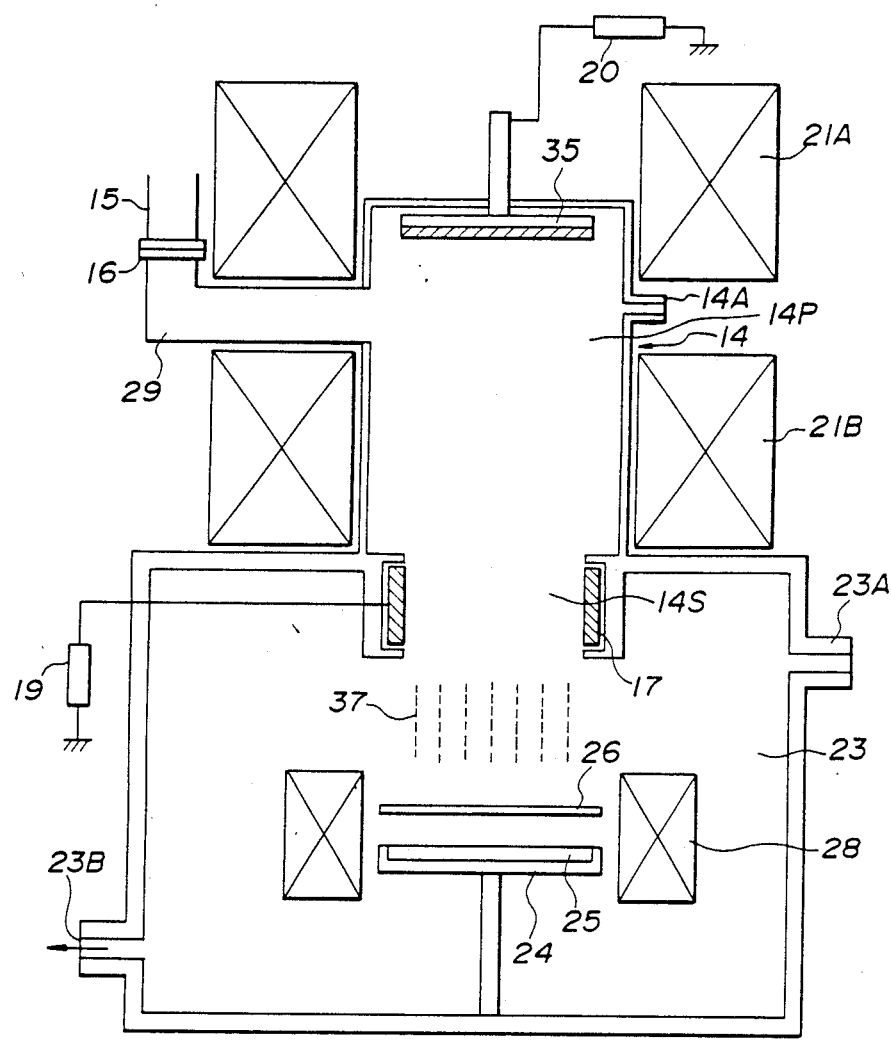
Figure 22:
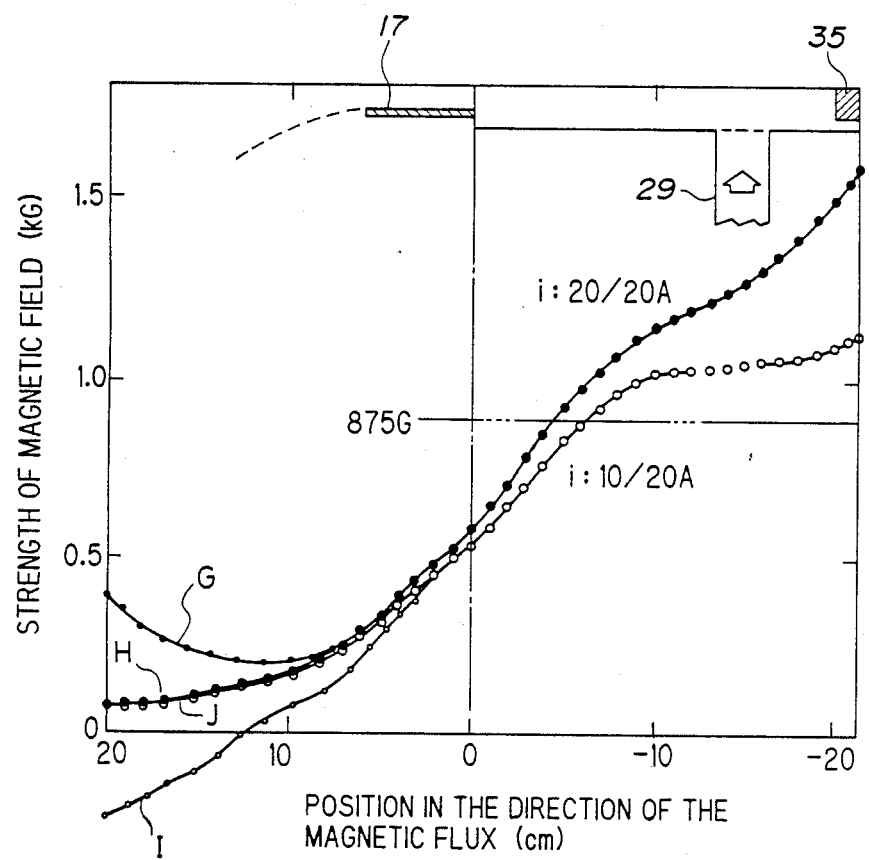
FIG. 22 illustrates a distribution of the magnetic field strength in the direction of the magnetic flux in the tenth embodiment shown in FIG. 21.

FIG. 21 illustrates a tenth embodiment of a thin film forming apparatus in accordance with the present invention which is substantially similar in construction to the sixth embodiment described above with reference to FIG. 15 except that an auxiliary electromagnet 28 is provided. The auxiliary electromagnet 28 may be disposed outside of the specimen chamber 23. The auxiliary electromagnet 28 is utilized to apply the magnetic field to the substrate 25 and the direction of this magnetic field is same as or opposite to the direction of the magnetic fields produced by the electromagnets 21A and 21B. FIG. 22 illustrates the distribution of the magnetic field strength in the direction of the magnetic flux. The curve G indicates the distribution of the magnetic field obtained when the current of 20A was made to flow through the electromagnets 21A and 21B and the direction of the magnetic flux induced by the auxiliary electromagnet 28 was same as the direction of the magnetic fluxes produced by the electromagnets 21A and 21B. The curve H illustrates the distribution obtained when the current of 20A was made to flow through the electromagnets 21A and 21B while no current was applied to the auxiliary electromagnet 28. The curve I illustrates the distribution obtained when the current of 10A was made to flow through the electromagnet 21A while the current of 20A was made to flow through the electromagnet 21B and the direction of the magnetic flux produced by the auxiliary electromagnet 28 was opposite to the direction of the magnetic fluxes produced by the electromagnets 21A and 21B. The curve J illustrates the distribution when the current of 10A was made to flow through the electromagnet 21A while the current of 20A was made to flow through the electromagnet 21B and no current was applied to the auxiliary electromagnet 28.

Figure 23:
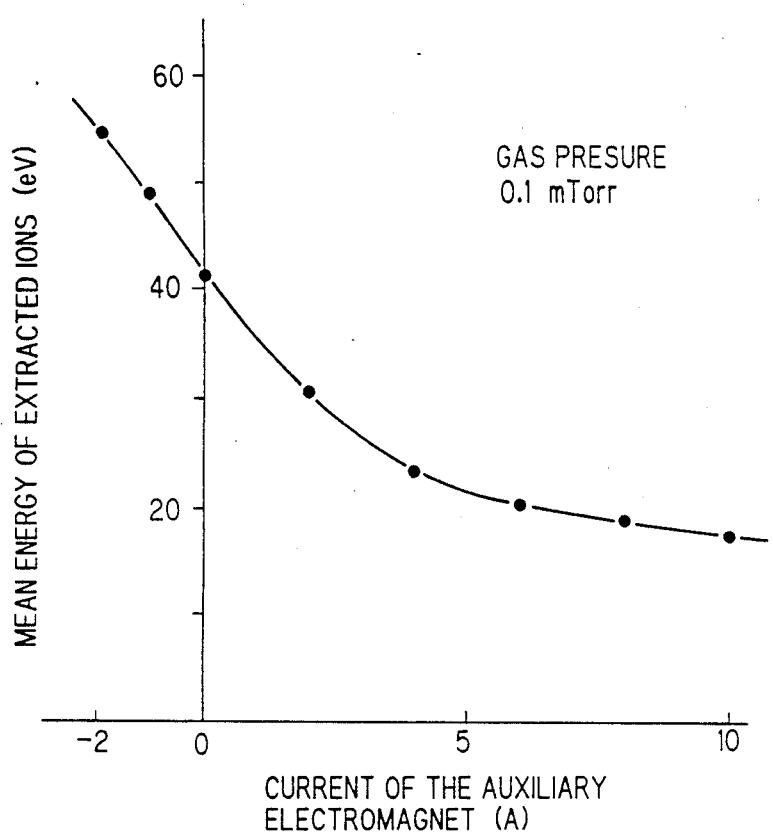
FIG. 23 illustrates the relationship between the incident ion energy on the substrate and the current flowing through the auxiliary electromagnet.

According to the tenth embodiment, the auxiliary electromagnet 28 is utilized to apply the magnetic field to the substrate 25 and the acceleration of the electrons in the direction of the substrate 25 is controlled by varying the gradient of the magnetic field produced by the auxiliary electromagnet 28 so that the energy of ions can be varied. FIG. 23 illustrates a variation in energy of incident ions on the substrate 25 when the magnitude of the current applied to the auxiliary electric magnet was varied.

By controlling the current flowing the auxiliary electromagnet 28 the magnetic flux entering cylindrical target 17 can be controlled, so that the fine control of the erosion distributions over the surfaces of the targets, the discharge condition and so on can be accomplished.

Next, the results of the formation of Al films by utilizing the tenth embodiment will be described. After the specimen chamber 23 is evacuated to a vacuum of $5 \times 10^{-7}$ Torr, Ar gas was introduced at a rate of 2 cc/min and the gas pressure within the plasma generating chamber was maintained at $3 \times 10^{-4}$ Torr. The Al films were formed under the conditions that the microwave power was between 100 and 500 W and the power supplied to the cylindrical aluminum target 17 was between 100 and 800 W and the substrate holder 24 was maintained at room temperature without heating. The results showed that the Al films could be formed at a deposition rate ranging from 10 to 150 nm/min continuously in a stable and efficient manner for a long period of time. In the experiments the mean energy of ions varied from 5 eV to 30 eV.

The discharge characteristic as well as the dependence of the deposition rate on the power supplied to the target are substantially similar to those shown in FIGS. 17 and 12, respectively.

In the thin film forming apparatuses of the type in which the microwave is introduced into the plasma generating chamber in the direction perpendicular to the axis of plasma, instead of the electromagnets, permanent magnets may be used. In addition, the combination of one or more permanent magnets and a yoke may be utilized. Furthermore, all the embodiments described above may be provided with an auxiliary electromagnet.

Figure 24:
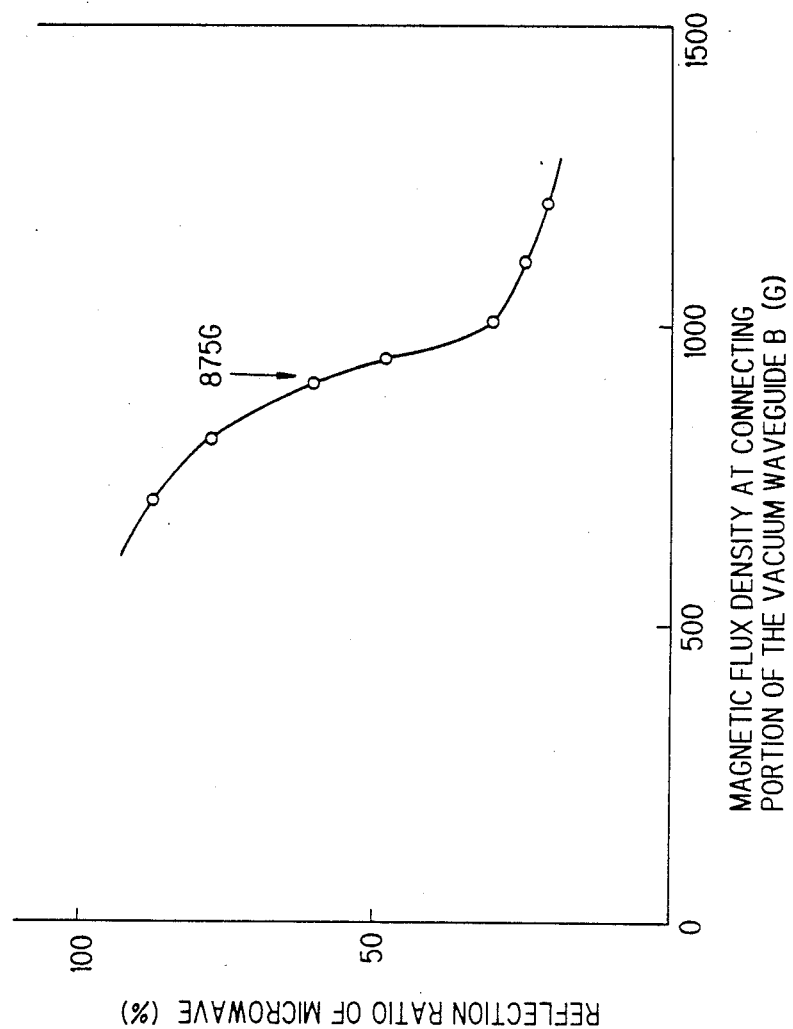
FIG. 24 illustrates a dependence of the reflection ratio of the microwave on the magnetic flux density at the connecting portion.
Figure 25:
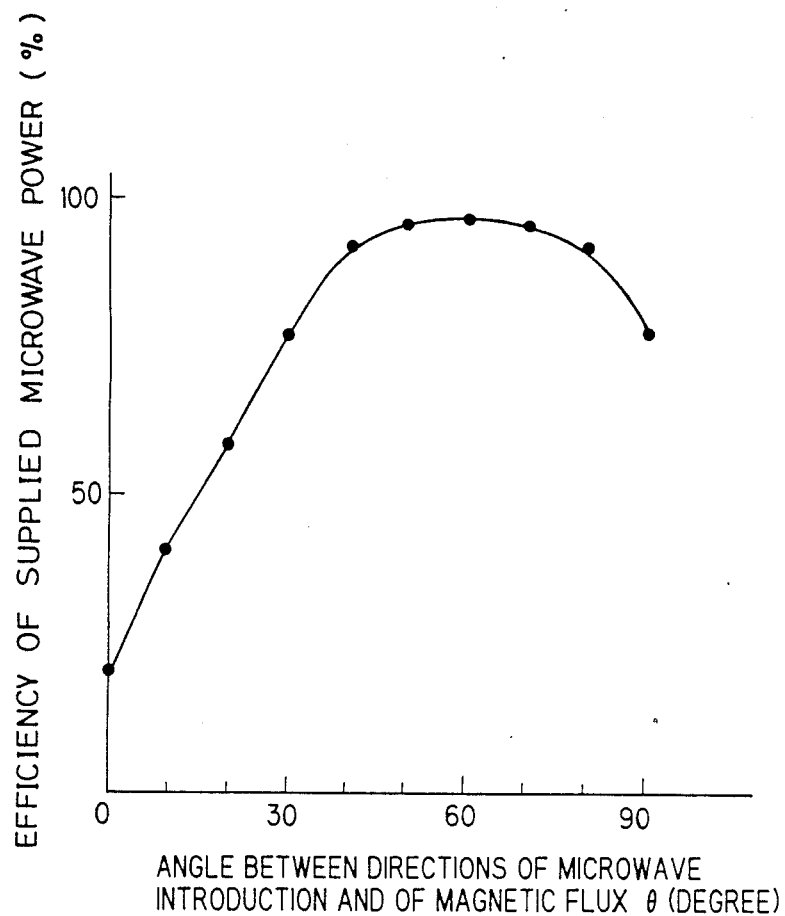
FIG. 25 illustrates a dependence of the efficiency of a microwave power on the angle between the directions of the microwave introduction and of the magnetic flux.

The refrection of the microwave introduced into the plasma generating chamber, and accordingly, the efficiency of the supplied microwave power depend on the magnetic flux density at the portion at which the vacuum waveguide is connected to the plasma generating chamber and on the angle between the directions of the microwave introduction and of the magnetic flux at the center axis of the plasma generating chamber or of the axis of plasma to be generated. FIG. 24 illustrates a dependence of the reflection ratio of the microwave on the magnetic flux density at the connecting portion of the vacuum waveguide with the plasma generating chamber when the vacuum waveguide is connected in the direction perpendicular to the magnetic flux. For experiments an apparatus which is similar to that shown in FIG. 15 was used. The reflection ratio decreases with the increase of the magnetic flux density. It is preferable that the magnetic flux density at the connecting portion is made higher than that of the ECR condition, 875 gauss for effectively introducing microwave. FIG. 25 illustrates dependence of the efficiency of the supplied microwave power on the angle $\theta$ between the directions of the microwave introduction and of the magnetic flux. Here, the efficiency of the microwave power means the ratio $(Pf - Pr)/Pr$, wherein Pf is a power of the incident microwave into the plasma and Pr is the power of microwave reflected from the plasma. Both of the Pf and Pr are measured with a microwave power meter. As seen from FIG. 25, the efficiency is low when angle $\theta$ is zero, that is when the microwave is introduced in the direction parallel with the magnetic flux. The efficiency initially increases with the angle $\theta$ and then decreases when $\theta$ becomes higher than 60°. The preferable range of $\theta$ is within 40° to 80° and more preferably $\theta$ is in the range of 50° to 70°. When the vacuum waveguide is connected with the plasma generating chamber in the direction inclined to the magnetic flux the acceleration of the plasma toward the vacuum waveguide is suppressed and the dim of the plasma introduction window with the sputtered particles can be prevented.

Next, the ion sources in accordance with the present invention and the thin film forming apparatuses utilizing such ion sources will be described hereinafter.

Figure 26:
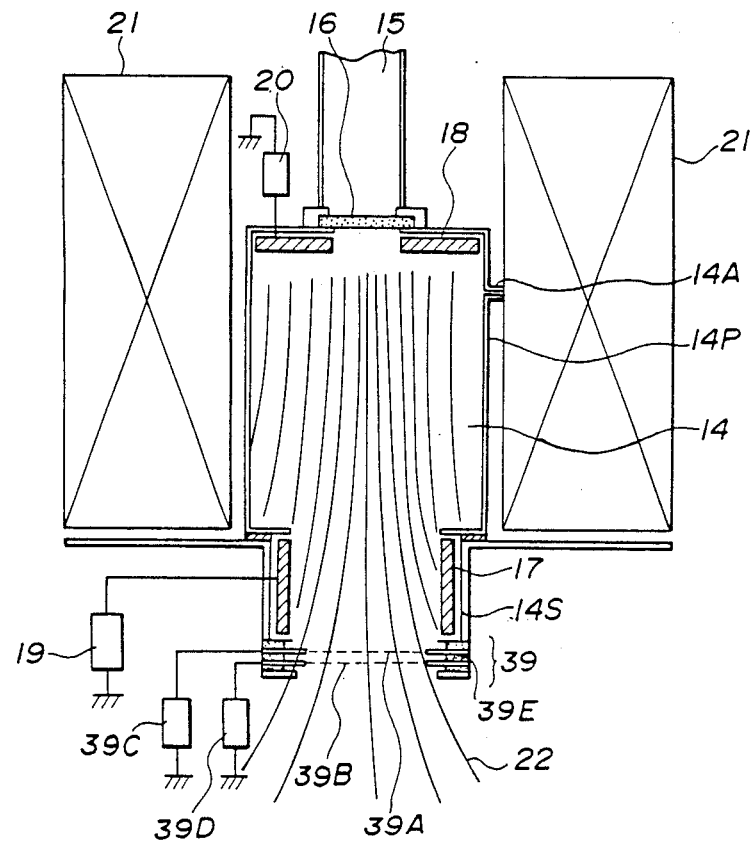
FIG. 26 is a sectional view illustrating a first embodiment of a sputtering type ion source in accordance with the present invention.
Figure 27:
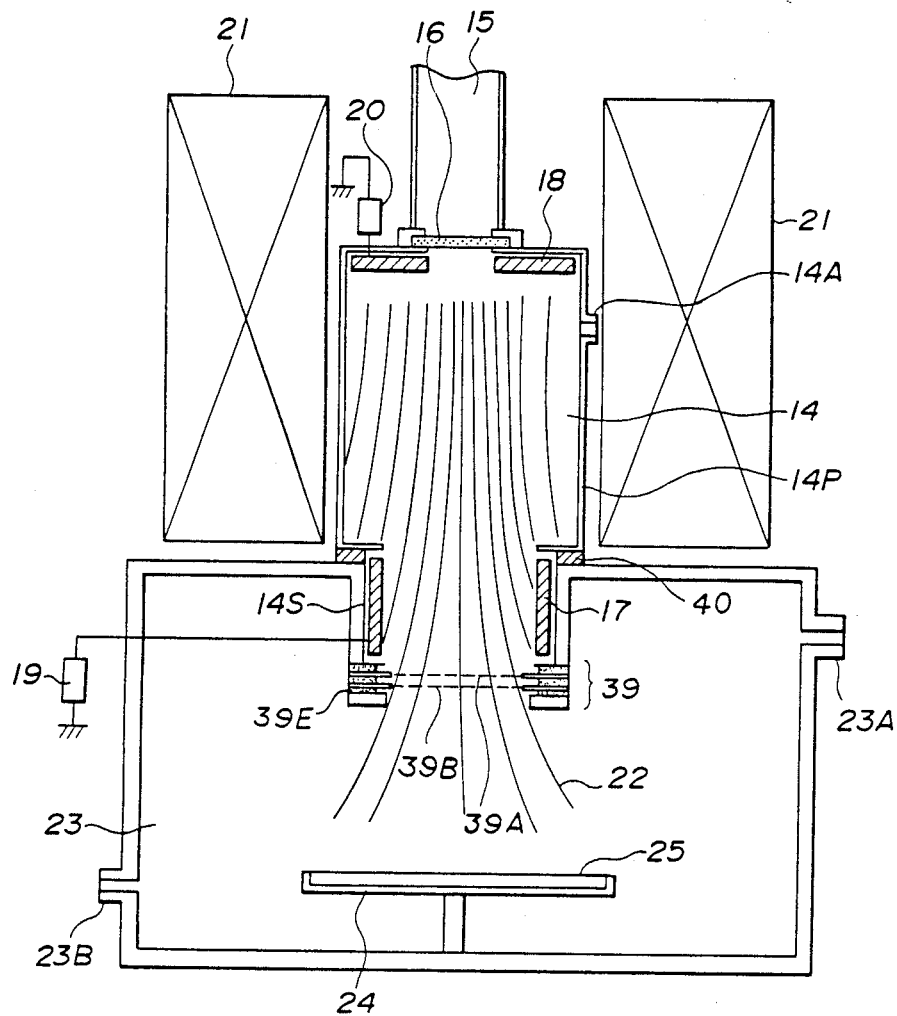
FIG. 27 is a sectional view illustrating a thin film forming apparatus utilizing the ion source shown in FIG. 26.

FIG. 26 illustrates a first embodiment of an ion source in accordance with the present invention and FIG. 27 illustrates a thin film forming apparatus utilizing the first embodiment of the ion source. As is clear from FIGS. 26 and 27, the first embodiment of the ion source is such that an ion extraction mechanism 39 is securely attached to the lower end of the target mounting section 14S of the plasma generating chamber 14 of the type described above with reference to FIG. 2. According to the first embodiment of the ion source, the ion extraction mechanism comprises two perforated grids 39A and 39B each of which is supported by the lower end portion of the target mounting section 14S of the plasma generating chamber 14 and which are applied with the negative voltages with respect to the plasma generating chamber 14, from power sources 39C and 39D, respectively. The perforated grids 39A and 39B are electrically insulated from each other and from the plasma generating chamber by an insulator 39E. It is preferable that the plasma generating chamber 14 is electrically insulated with an insulator 40 from the specimen chamber 23 for applying a voltage to the plasma generating chamber.

As described above, high-density plasma is generated in the plasma generating chamber 14. The ions in the plasma are selectively extracted by the ion extraction mechanism 39 out of the plasma generating chamber 14.

The energy of the extracted ions can be controlled by acceleration voltages which are relative differences between the voltage applied to the plasma generating chamber 14 and the voltage applied to the upper perforated grid 39A. The plasma generating chamber may be applied with a positive voltage. Thus the low energy ions ranging from several tens eV to tens keV can be extracted. In FIG. 27, the power supplies 39C and 39 for applying the negative voltages to the grids 39A and 39B, respectively, are not shown.

Figure 28:
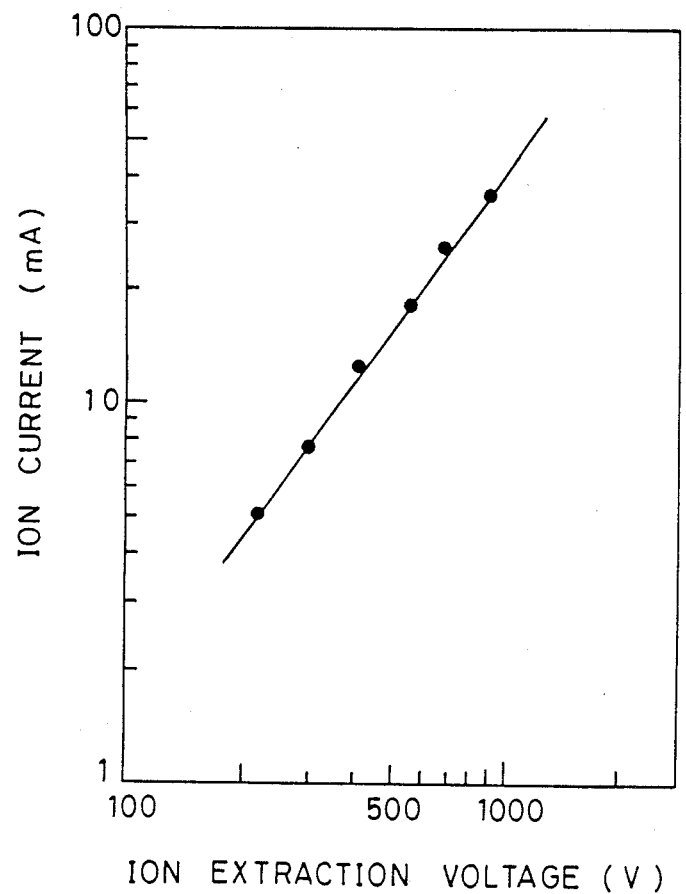
FIG. 28 illustrates an ion extraction characteristic of the first embodiment of the ion source shown in FIG. 26.

The discharge characteristics of the first embodiment of the ion source shown in FIGS. 26 and 27 is substantially similar to that shown in FIG. 6. FIG. 28 illustrates the ion extraction characteristics of the first embodiment of the ion source. The ion extraction voltage plotted along the abscissa represents a relative difference in voltage between the plasma generating chamber 14 and the grid 39A. By utilizing the thin film forming apparatus shown in FIG. 27, the thin films were formed under the condition that the substrate holder 24 was not heated. The Al films were deposited at a deposition rate ranging from 0.3 to 5 nm/min continuously in a stable and efficient manner for a long period of time.

An ion source can be constructed by incorporating an ion extraction mechanism with a plasma generating chamber to which a vacuum waveguide surrounded with a yoke as shown in FIG. 9.

Also, in the cases of the embodiments of the thin film forming apparatus described above with reference to FIGS. 7, 13 and 14, respectively, and their modifications, an ion source can be obtained by incorporating the ion extraction mechanism to the lower end of the plasma generating chamber and by utilizing such ion sources, the thin film forming apparatuses can be constructed.

Figure 29:
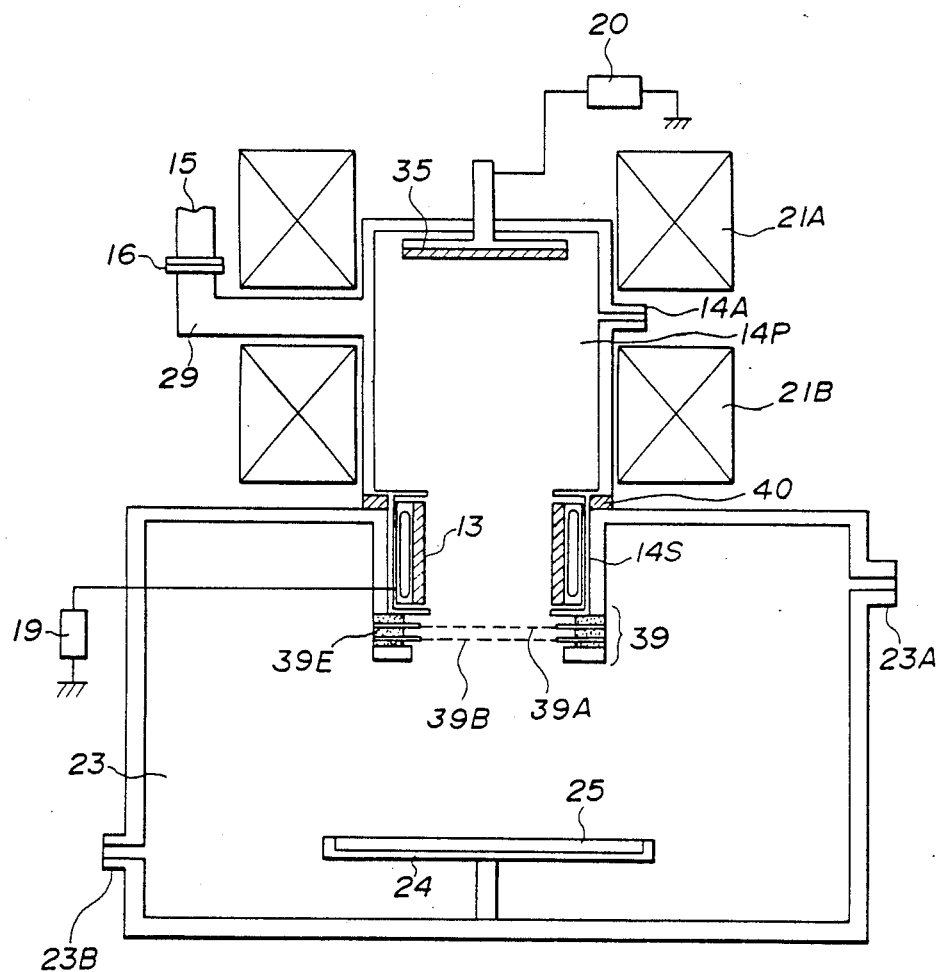
FIG. 29 is a sectional view illustrating a thin film forming apparatus utilizing the second embodiment of an ion source in accordance with the present invention.

FIG. 29 illustrates a thin film forming apparatus incorporating a second embodiment of the ion source in accordance with the present invention. As is clear from the figure, this embodiment of the ion source is such that the ion extraction mechanism 39 is attached to the lower end of the plasma generating chamber 14 of the thin film forming apparatus shown in FIG. 15. In FIG. 29, the power supplies 39C and 39D are not shown. The arrangement of the targets and the electromagnets are substantially similar to that of the film forming apparatus described above with reference to FIG. 15. It follows therefore that, as described above, high-density plasma can be generated in the plasma generating chamber 14 and the ions in plasma can be efficiently extracted as an ion beam. The discharge characteristics of this embodiment of the on source is substantially similar to that shown in FIG. 17.

The ion extraction characteristics of the second embodiment of the ion source were better than that of the first embodiment shown in FIG. 26. The thin Al films were formed over the surfaces of the substrates which were mounted on the substrate holder 24 which was not heated. In other words, the films were formed at room temperature. The experimental results showed that each Al film was continuously formed at a deposition rate ranging from 1-10 nm/min in a stable and efficient manner for a long period of time.

It is clear that the planar target 35 can be replaced by a cylindrical or tubular target.

The apparatuses for generating plasma by introducing the microwave into the plasma generating chamber in the direction perpendicular to the axis of plasma; that is, embodiments described above with reference to FIGS. 18, 19, 20 and 21, respectively, and their modifications can be converted into an ion source by incorporating the ion extraction mechanism at the lower end of the plasma generating chamber of each apparatus. Further, the microwave can be introduced in the direction relatively inclined with the axial direction of the plasma to be generated. Furthermore, by utilizing such ion sources, the thin film forming apparatuses can be constructed.

In the ion sources in accordance with the present invention, an anode may be used in order to control the plasma potential. That is, for instance, a cylindrical anode is disposed within the plasma generating chamber and is applied with a voltage so that the potential of plasma can be controlled, and consequently the ion extraction efficiency of the ion extraction mechanism can be further enhanced. Furthermore, the energy of ions can be controlled in response to the voltage applied to the anode.

In the cases of the embodiments of the ion source described above, the ion extraction mechanism 39 has been described as comprising two perforated grids, but it is to be understood that it may comprises only one perforated grid. That is, when the perforated grid 39A on the side of plasma is eliminated and only one perforated accelerating grid is used, even though the latter grid is subjected to the direct bombardment of ions, but the ion extraction efficiency is higher than that of the ion extraction mechanism 39 consisting of two grids 39A and 39B in the low energy range less than 200 eV.

As described above, the thin film forming apparatuses in accordance with the present invention can generate microwave-plasma by ECR, and plasma thus generated is utilized in sputtering so that the continuous formation of thin films can be realized at low temperatures in a low gas pressure at a high efficiency in a stable manner for a long period of time regulardless of the electric conductivity and the thickness of a film being grown. Furthermore, with the apparatus according to the present invention the energy of particles can be controlled over a wide range from a few eV to several keV and highly active plasma is utilized, hence a high quality thin film almost free from damage can be continuously formed at a high deposition rate in a highly stabilized manner over a substrate which is maintained at a relatively low temperature. In addition, the targets are so arranged and the magnetic field is so produced that high-energy electrons are reflected back into plasma, whereby the formation of a thin film at a high deposition rate can be realized.

In the cases of the thin film forming apparatuses and ion sources in accordance with the present invention of the type in which the microwave is introduced into the plasma generating chamber in the direction of the axis of plasma, when a vacuum waveguide surrounded with a yoke, the reflection of the microwave due to the contamination of the microwave introduction window with an electrically conductive film can be neglected, so that even an electrically conductive film can be continuously formed in a stable manner for a long period of time.

When the vacuum waveguide is connected to the plasma generating chamber in the direction perpendicular to the direction of the magnetic flux, the propagation of plasma into the vacuum waveguide can be inhibited. As a result the contamination of the microwave introduction window due to the adherence of an electrically conductive film thereto can be prevented, so that the reflection of the microwave can be neglected and therefore an electrically conductive film as a metal can be continuously formed in a stable manner for a long period of time.

Naturally, the plasma generating chamber, to which a vacuum waveguide is connected in the direction inclined to the magnetic flux, is usable in the ion source according to the present invention.

The ion sources in accordance with the present invention utilizes microwave plasma generated by ECR for sputtering, so that the ion extraction can be realized in a low pressure gas at a high efficiency. It follows therefore that regardless of kinds of ions and the conductivity and thickness of a film being grown by the deposition of the sputtered particles, the ions can be extracted continuously in a stable manner for a long period of time.

The invention has been described in detail with respect to preferred embodiments, and it will now be apparent from the foregoing to those skilled in the art that changes and modifications may be made without departing from the invention in its broader aspects, and it is the invention, therefore, in the appended claims to cover all such changes and modifications as fall within the true spirit of the invention.

What is claimed is:

1. A thin film forming apparatus comprising:
    a plasma generating chamber into which a gas is introduced to generate plasma, at least one end portion of said plasma generating chamber having a specimen chamber having a substrate holder installed therein and communicated to an interior of said plasma generating chamber;
    a microwave introduction window for introducing microwave into said plasma generating chamber;
    a first target made of a material to be sputtered and mounted at one portion of the interior of said plasma generating chamber;
    a second target made of a material to be sputtered and mounted at another end portion of the interior of said plasma generating chamber,
    at least one of said first and second targets, which is mounted on a side of said at least one end portion where said specimen chamber is communicated, being in the form of a tube;
    at least one power supply for applying a negative voltage to said first and second targets; and
    magnetic field producing means for producing a magnetic field within said plasma generating chamber and for producing magnetic flux leaving from a surface of one of said first and second targets and entering a surface of the other target.

2. A thin film forming apparatus as claimed in claim 1, wherein said plasma generating chamber is structured in a manner that said plasma is generated by microwave electron cyclotron resonance discharge.

3. A thin film forming apparatus as claimed in claim 1, wherein said microwave is introduced into said plasma generating chamber in the direction of an axis of the plasma to be generated, and said microwave introduction window is connected through a vacuum waveguide to said plasma generating chamber; further comprising a yoke surrounding said vacuum waveguide so that the magnetic field produced by said magnetic field producing means is absorbed, the magnetic field strength within said vacuum waveguide being decreased and the magnetic field strength being sharply changed at the boundary between said vacuum waveguide and said plasma generating chamber.

4. A thin film forming apparatus as claimed in claim 3, wherein said microwave introduction window is located at such a position that particles sputtered from both of said first and second targets and flying toward said position collide with an inner wall of said vacuum waveguide before they reach said position.

5. A thin film forming apparatus as claimed in claim 1, wherein one of said first and second targets is in the form of a tube while the other, is in the form of a flat plate.

6. A thin film forming apparatus as claimed in claim 1, wherein both of said first and second targets are in the form of a tube.

7. A thin film forming apparatus as claimed in claim 6, wherein specimen chambers are communicated to both ends, respectively, of said plasma generating chamber.

8. A thin film forming apparatus as claimed in claim 7, wherein said first and second targets are distinct end portions, respectively, of one target in the form of a tube.

9. A thin film forming apparatus as claimed in claim 1, further comprising auxiliary magnetic field producing means, disposed in the vicinity of said substrate holder so as to control the magnetic field produced by said magnetic field producing means.

10. A thin film forming apparatus as claimed in claim 1, wherein said microwave is introduced in a direction intersecting an axis of the plasma to be generated.

11. A thin film forming apparatus as claimed in claim 1, wherein said at least one target having a tubular form is in the form of a polygonal tube.

12. An ion source comprising:
    a plasma generating chamber into which a gas is introduced to generate plasma;
    a microwave introduction window for introducing microwave into said plasma generating chamber;
    'an ion extraction mechanism disposed at one end of said plasma generating chamber;
    a first target made of a material to be sputtered, and disposed at one end portion of an interior of said plasma generating chamber;
    a second target made of a material to be sputtered and disposed at another end portion of the interior of said plasma generating chamber at least one of said first and second targets being in the form of a tube;
    at least one power supply for applying to said first and second targets a voltage which is negative with respect to a potential of said plasma generating chamber; and
    magnetic field producing means for producing a magnetic field, and for producing magnetic flux leaving one of said first and second targets and entering the other target.

13. An ion source as claimed in claim 12, wherein said plasma generating chamber is structured in a manner that said plasma is generated by microwave electron cyclotron resonance discharge.

14. An ion source as claimed in claim 12, wherein said microwave is introduced into said plasma generating chamber in the direction of an axis of the plasma, and said microwave introduction window is connected through a vacuum waveguide to said plasma generating chamber; further comprising a yoke surrounding said vacuum waveguide so that the magnetic field produced by said magnetic field producing means is absorbed, the magnetic field strength within said vacuum waveguide is decreased and the magnetic field strength is sharply changed at the boundary between said vacuum waveguide and said plasma generating chamber.

15. An ion source as claimed in claim 14, wherein said microwave introduction window is located at a position such that particles sputtered from both of said first and second targets and flying toward said position collide with an inner wall of said vacuum waveguide before they reach said position.

16. An ion source as claimed in claim 12, wherein one of said first and second targets is in the form of a tube while the other, in the form of a flat plate.

17. An ion source as claimed in claim 12, wherein both of said first and second targets are in the form of a tube.

18. An ion source as claimed in claim 17, wherein specimen chambers are communicated to both ends, respectively, of said plasma generating chamber.

19. An ion source as claimed in claim 12, wherein said first and second targets are the distinct portions, respectively, of one target in the form of a tube.

20. An ion source as claimed in claim 12, wherein auxiliary magnetic field producing means is disposed in the vicinity of said substrate holder so as to control the magnetic field produced by said magnetic field producing means.

21. An ion source as claimed in claim 12, wherein said ion extracting mechanism comprises two perforated grids.

22. An ion source as claimed in claim 12, wherein said ion extracting mechanism comprises a single perforated grid.

23. An ion source as claimed in claim 12, wherein said at least one target having a tubular form is in the form of a polygonal tube.

24. An ion source as claimed in claim 12, wherein said microwave is introduced in a direction intersecting an axis of plasma to be generated.

25. A thin film forming apparatus comprising:
a plasma generating chamber into which a gas is introduced to generate plasma, said plasma generating chamber being structured in such a manner that said plasma is generated by a microwave electron cyclotron resonance discharge;
a microwave introduction window, connected to said plasma generating chamber, for introducing microwave thereinto;
an ion extraction mechanism disposed at one end of said plasma generating chamber;
a first target made of a material to be sputtered and disposed at one end portion of an interior of said plasma generating chamber;
a second target made of a material to be sputtered and disposed at another end portion of the interior of said plasma generating chamber,
at least one of said first and second targets being in the form of a tube;
at least one power supply for applying to said first and second target a voltage which is negative with respect to a voltage of said plasma generating chamber;
magnetic field producing means for producing a magnetic field such that magnetic flux leaves one of said first and second targets and enters the other target; and
a specimen chamber connected to said plasma generating chamber and having a substrate holder therein.

26. A plasma generating apparatus comprising:
a plasma generating chamber into which a gas is introduced to generate plasma, said plasma generating chamber being structured in such a manner that said plasma is generated by a microwave electron cyclotron resonance discharge;
a microwave introduction window for introducing the microwave into said plasma generating chamber;
a first target made of a material to be sputtered and disposed at one end portion of an interior of said plasma generating chamber;
a second target made of a material to be sputtered and disposed at another end portion of the interior of said plasma generating chamber, at least one of said first and second targets being in the form of a tube;
at least one power supply for applying to said first and second target a voltage which is negative with respect to a voltage of said plasma generating chamber; and
magnetic field producing means for producing a magnetic field such magnetic flux leaves one of said first and second targets and enters the other target.

* * * * *